US012795955B2

(12) United States Patent
Min et al.

(10) Patent No.: US 12,795,955 B2
(45) Date of Patent: Nov. 10, 2026

(54) MEMORY DEVICE

(71) Applicant: SAMSUNG ELECTRONICS CO., LTD., Suwon-si (KR)

(72) Inventors: Taehong Min, Suwon-si (KR); Minchul Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 308 days.

(21) Appl. No.: 18/756,794

(22) Filed: Jun. 27, 2024

(65) Prior Publication Data

US 2025/0040156 A1 Jan. 30, 2025

(30) Foreign Application Priority Data

Jul. 28, 2023 (KR) ........................ 10-2023-0098999

(51) Int. Cl.
*H10B 99/00* (2023.01)

(52) U.S. Cl.
CPC .................................... *H10B 99/10* (2023.02)

(58) Field of Classification Search
CPC ...................................................... H10B 99/10
See application file for complete search history.

(56) References Cited

U.S. PATENT DOCUMENTS 7,230,705 B1 6/2007 Yang et al.
7,541,201 B2 6/2009 Ghinovker
7,670,904 B2 * 3/2010 Lee ........................ H10B 41/40 438/257
8,148,682 B2 4/2012 Hotta et al.
8,278,759 B2 10/2012 Kim
8,442,320 B2 5/2013 Isomura et al.
9,368,646 B2 * 6/2016 Kim ........................ H10B 43/27
9,785,059 B2 10/2017 Brill et al.
9,835,447 B2 12/2017 Abdulhalim et al.
10,068,323 B2 9/2018 Sah et al.
2002/0096705 A1 * 7/2002 Choi ........................ H10B 69/00 257/315

(Continued)

FOREIGN PATENT DOCUMENTS

CN 113871412 A 12/2021
KR 10-2005-0059904 A 6/2005
KR 10-2013-0013384 A 2/2013

*Primary Examiner* — William A Harriston
(74) *Attorney, Agent, or Firm* — Sughrue Mion, PLLC

(57) ABSTRACT

A memory device includes: first conductive lines extending in a first horizontal direction on a substrate; second conductive lines extending on the first conductive lines in a second horizontal direction; third conductive lines extending on the second conductive lines in the first horizontal direction; first memory cells provided at portions where the first conductive lines cross the second conductive lines; second memory cells provided at portions where the second conductive lines cross the third conductive lines; first dummy patterns horizontally spaced apart from the first memory cells and the second memory cells; and second dummy patterns horizontally spaced apart from the first memory cells and the second memory cells, the second dummy patterns facing the first dummy patterns, respectively, in the second horizontal direction. The plurality of first dummy patterns and the plurality of second dummy patterns are on different vertical levels from each other.

20 Claims, 34 Drawing Sheets

(56) References Cited

U.S. PATENT DOCUMENTS

| | | | | |
|---|---|---|---|---|
| 2006/0231906 | A1 | 10/2006 | Ko et al. | |
| 2021/0066280 | A1 * | 3/2021 | Park | H10B 41/27 |
| 2024/0312935 | A1 * | 9/2024 | Jang | H10B 43/27 |
| 2024/0419884 | A1 * | 12/2024 | Jung | G06F 30/3953 |

* cited by examiner

MEMORY DEVICE

CROSS-REFERENCE TO RELATED APPLICATION

This application claims priority to Korean Patent Application No. 10-2023-0098999, filed on Jul. 28, 2023, in the Korean Intellectual Property office, the disclosure of which is incorporated by reference herein in its entirety.

BACKGROUND

The present disclosure relates to a memory device. More particularly, the present disclosure relates to a memory device including a plurality of memory cells.

With the development of electronics technology, various research on down-scaling and increasing a degree of integration has been performed. Particularly, a memory device including a plurality of memory cells having a three-dimensional arrangement structure has been proposed as one of the methods to increase the degree of integration of the memory device.

SUMMARY

One or more embodiments provide a memory device with improved reliability.

According to an aspect of an embodiment, a memory device includes: a plurality of first conductive lines extending in a first horizontal direction on a substrate; a plurality of second conductive lines extending on the plurality of first conductive lines in a second horizontal direction that crosses the first horizontal direction; a plurality of third conductive lines extending on the plurality of second conductive lines in the first horizontal direction; a plurality of first memory cells provided at portions where the plurality of first conductive lines cross the plurality of second conductive lines; a plurality of second memory cells provided at portions where the plurality of second conductive lines cross the plurality of third conductive lines; a plurality of first dummy patterns horizontally spaced apart from the plurality of first memory cells and the plurality of second memory cells; and a plurality of second dummy patterns horizontally spaced apart from the plurality of first memory cells and the plurality of second memory cells, the plurality of second dummy patterns facing the plurality of first dummy patterns, respectively, in the second horizontal direction. The plurality of first dummy patterns and the plurality of second dummy patterns are on different vertical levels from each other.

According to another aspect of an embodiment, a memory device includes: a wiring structure on a substrate; a plurality of first conductive lines extending in a first horizontal direction on the wiring structure; a plurality of contacts configured to connect the wiring structure to the plurality of first conductive lines; a plurality of second conductive lines extending on the plurality of first conductive lines in a second horizontal direction that crosses the first horizontal direction; a plurality of third conductive lines extending on the plurality of second conductive lines in the first horizontal direction; a plurality of first memory cells provided at portions where the plurality of first conductive lines cross the plurality of second conductive lines; a plurality of second memory cells provided at portions where the plurality of second conductive lines cross the plurality of third conductive lines; a plurality of dummy patterns horizontally spaced apart from the plurality of first memory cells and the plurality of second memory cells; and a plurality of dummy contacts horizontally spaced apart from the plurality of first memory cells and the plurality of second memory cells, the plurality of dummy contacts facing the plurality of dummy patterns, respectively, in the first horizontal direction. The plurality of dummy patterns and the plurality of dummy contacts are on different vertical levels from each other.

According to another aspect of an embodiment, a memory device includes: a periphery circuit structure on a substrate; and a cell array structure on the periphery circuit structure. The cell array structure includes: a plurality of first conductive lines extending on the substrate in a first horizontal direction; a plurality of second conductive lines extending on the plurality of first conductive lines in a second horizontal direction that crosses the first horizontal direction, the plurality of second conductive lines including a plurality of second lower conductive lines and a plurality of second upper conductive lines; a plurality of third conductive lines extending on the plurality of second conductive lines in the first horizontal direction; a plurality of first memory cells provided at portions where the plurality of first conductive lines cross the plurality of second conductive lines; a plurality of second memory cells provided at portions where the plurality of second conductive lines cross the plurality of third conductive lines; a plurality of first dummy patterns horizontally spaced apart from the plurality of first memory cells and the plurality of second memory cells; and a plurality of second dummy patterns horizontally spaced apart from the plurality of first memory cells and the plurality of second memory cells, the plurality of second dummy patterns facing the plurality of first dummy patterns, respectively, in the second horizontal direction. The plurality of second upper conductive lines and the plurality of second lower conductive lines completely overlap each other in a vertical direction perpendicular to the first horizontal direction and the second horizontal direction, and are at different vertical levels from the substrate along the vertical direction. The plurality of first dummy patterns and the plurality of second dummy patterns are spaced apart from each other in the second horizontal direction, the plurality of first dummy patterns and the plurality of second upper conductive lines are commonly provided at a first level along the vertical direction, and the plurality of second dummy patterns and the plurality of second lower conductive lines are commonly provided at a second level along the vertical direction.

BRIEF DESCRIPTION OF DRAWINGS

The above and other aspects and features will be more apparent from the following description of embodiments, taken in conjunction with the accompanying drawings, in which.

DETAILED DESCRIPTION

Figure 1:
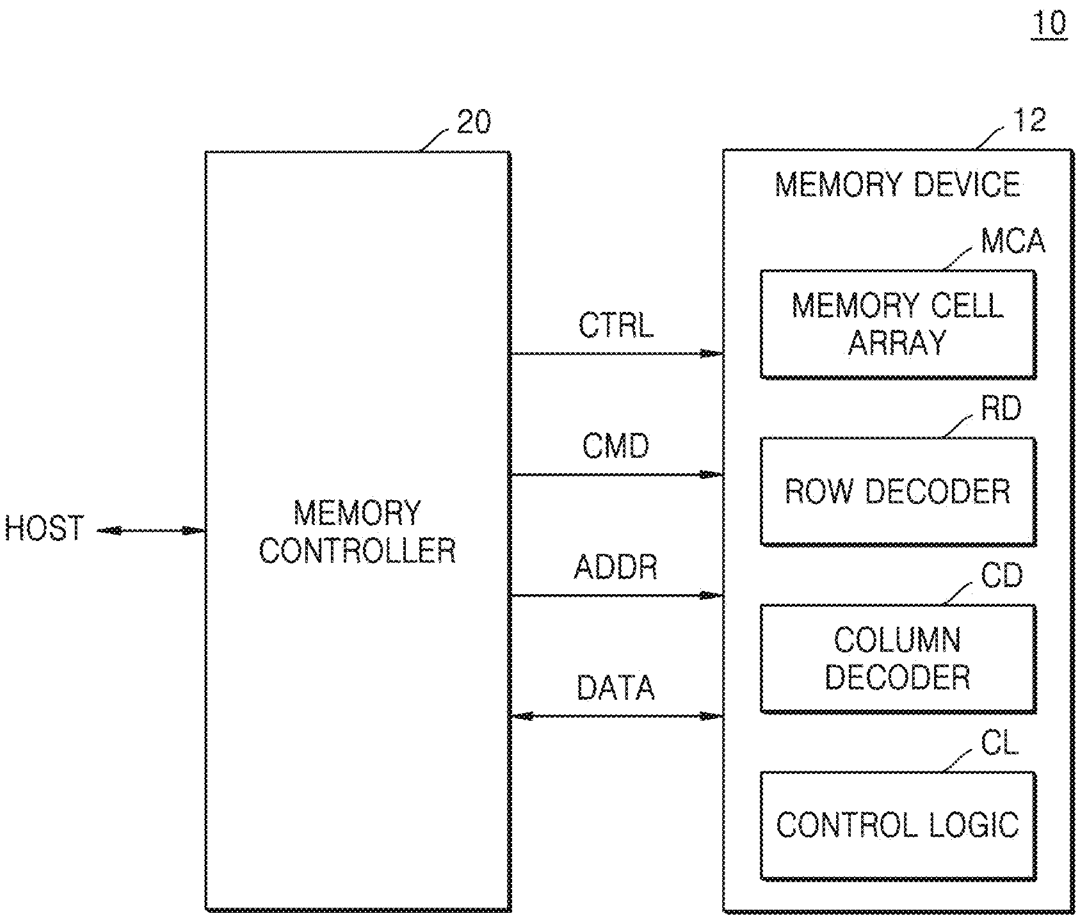
FIG. 1 is a block diagram of a memory system including a memory device, according to an embodiment.

Hereinafter, embodiments are described with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. Identical components on the drawings use identical reference numerals, and duplicate descriptions thereof are omitted.

FIG. 1 is a block diagram of a memory system 10 including a memory device 12, according to an embodiment.

Referring to FIG. 1, the memory system 10 may include the memory device 12 and a memory controller 20. The memory device 12 may include a memory cell array MCA, a row decoder RD, a column decoder CD, and a control logic CL.

The memory controller 20 may read data stored in the memory device 12 in response to a write/read request from a host HOST, or control the memory device 12 to write data in the memory device 12. By providing an address ADDR, a command CMD, and a control signal CTRL to the memory device 12, the memory controller 20 may control program (or write), read, and erase operations on the memory device 12. In addition, data DATA to be written and data DATA read may be transceived between the memory controller 20 and the memory device 12.

The memory cell array MCA may include a plurality of memory cells each arranged in regions where a plurality of first signal lines and a plurality of second signal lines cross each other. The plurality of first signal lines may include a plurality of word lines, and the plurality of second signal lines may include a plurality of bit lines. Each of the plurality of memory cells may include a single level cell (SLC) storing one bit, a multi-level cell (MLC) storing at least two bits of data, or a combination thereof.

The memory cell array MCA may include the memory cells including variable resistance devices. When a variable resistance device includes a phase-change material, in which resistance of the phase-change material changes according to temperature, the memory device 12 may be a phase-change random access memory (RAM) (PRAM) device.

The row decoder RD may drive the plurality of word lines constituting the memory cell array MCA, and the column decoder CD may drive the plurality of bit lines constituting the memory cell array MCA. The row decoder RD may include a decoding circuit for decoding a row address and a switch circuit for which switching is controlled in response to various row control signals according to the decoding result. The column decoder CD may include a decoding circuit for decoding a column address and a switch circuit for which switching is controlled in response to various column control signals according to the decoding result.

The control logic CL may control the overall operation of the memory device 12, and may control the row decoder RD and the column decoder CD to perform an operation of selecting the memory cell in the memory cell array MCA. As an example, the control logic CL may generate a row address and a column address by processing an address provided from the outside (e.g., from an external device). The memory device 12 may include a power generation circuit generating various write voltages and read voltages used in write and read operations, and the write voltage and the read voltage may be provided to the memory cell via the row decoder RD and the column decoder CD under control by the control logic CL.

Figure 2:
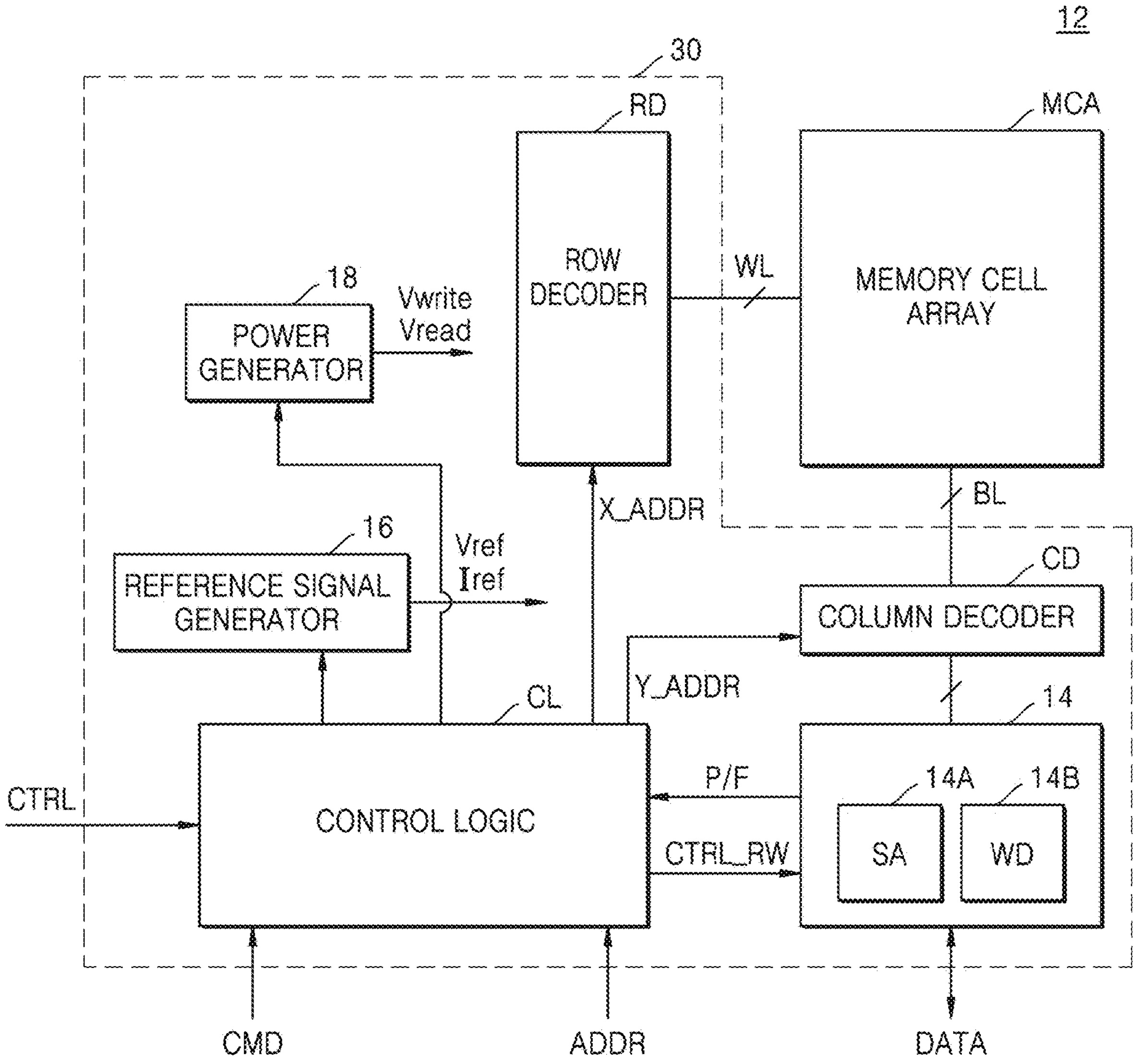
FIG. 2 is a block diagram of an example configuration of the memory device illustrated in FIG. 1, according to an embodiment.

FIG. 2 is a block diagram of an example configuration of the memory device 12 illustrated in FIG. 1.

Referring to FIG. 2, the memory device 12 may include the memory cell array MCA and a periphery circuit 30. The periphery circuit 30 may include the row decoder RD, the column decoder CD, and the control logic CL. In addition, the periphery circuit 30 may further include a write/read circuit 14, a reference signal generator 16, and a power generator 18. The write/read circuit 14 may include a sense amplifier 14A and a write driver 14B.

The memory cell array MCA may include the plurality of memory cells connected to a plurality of word lines WL and a plurality of bit lines BL. Various voltage signals or current signals may be provided to the memory cell array MCA via the plurality of word lines WL and the plurality of bit lines BL, and accordingly, data may be written to or read from the memory cells selected from the memory cell array MCA, and a write or read operation may be prevented from being performed on unselected memory cells.

The address ADDR for directing the memory cell to access based on the command CMD may be received in the control logic CL. The address ADDR may include a row address X_ADDR for selecting the word line WL of the memory cell array MCA and a column address Y_ADDR for selecting the bit line BL of the memory cell array MCA. The row decoder RD may perform a word line selection operation in response to the row address X_ADDR, and the column decoder CD may perform a bit line selection operation in response to the column address Y_ADDR.

The write/read circuit 14 may be connected to the bit line BL to write data to the memory cell, or read data from the memory cell. The power generator 18 may generate a write voltage Vwrite used for the write operation, and a read voltage Vread used for the read operation. The write voltage Vwrite may include a set voltage and a reset voltage. The write voltage Vwrite and the read voltage Vread may be provided to the bit line BL via the column decoder CD, or to the word line WL via the row decoder RD. The reference signal generator 16 may generate a reference voltage Vref and a reference current Iref as various reference signals related to a data read operation.

In the write/read circuit 14, the sense amplifier 14A may be connected to a sensing node of the bit line BL to determine data by using the reference voltage Vref or the reference current Iref. The write/read circuit 14 may provide, to the control logic CL, a pass/fail signal P/F according to the determination result of the read data. The control logic CL may control write and read operations of the memory cell array MCA with reference to the pass/fail signal P/F. The control logic CL may output various control signals CTRL_RW for writing data to or reading data from the memory cell array MCA, based on the address ADDR, the command CMD, and the control signal CTRL, which are received from the memory controller 20 (refer to FIG. 1).

The periphery circuit 30 may further include various circuits, such as a voltage generation circuit for generating various voltages necessary for the operations of the memory device 12, an error correction circuit for correcting errors in data read from the memory cell array MCA, and an input/output interface.

Figure 3:
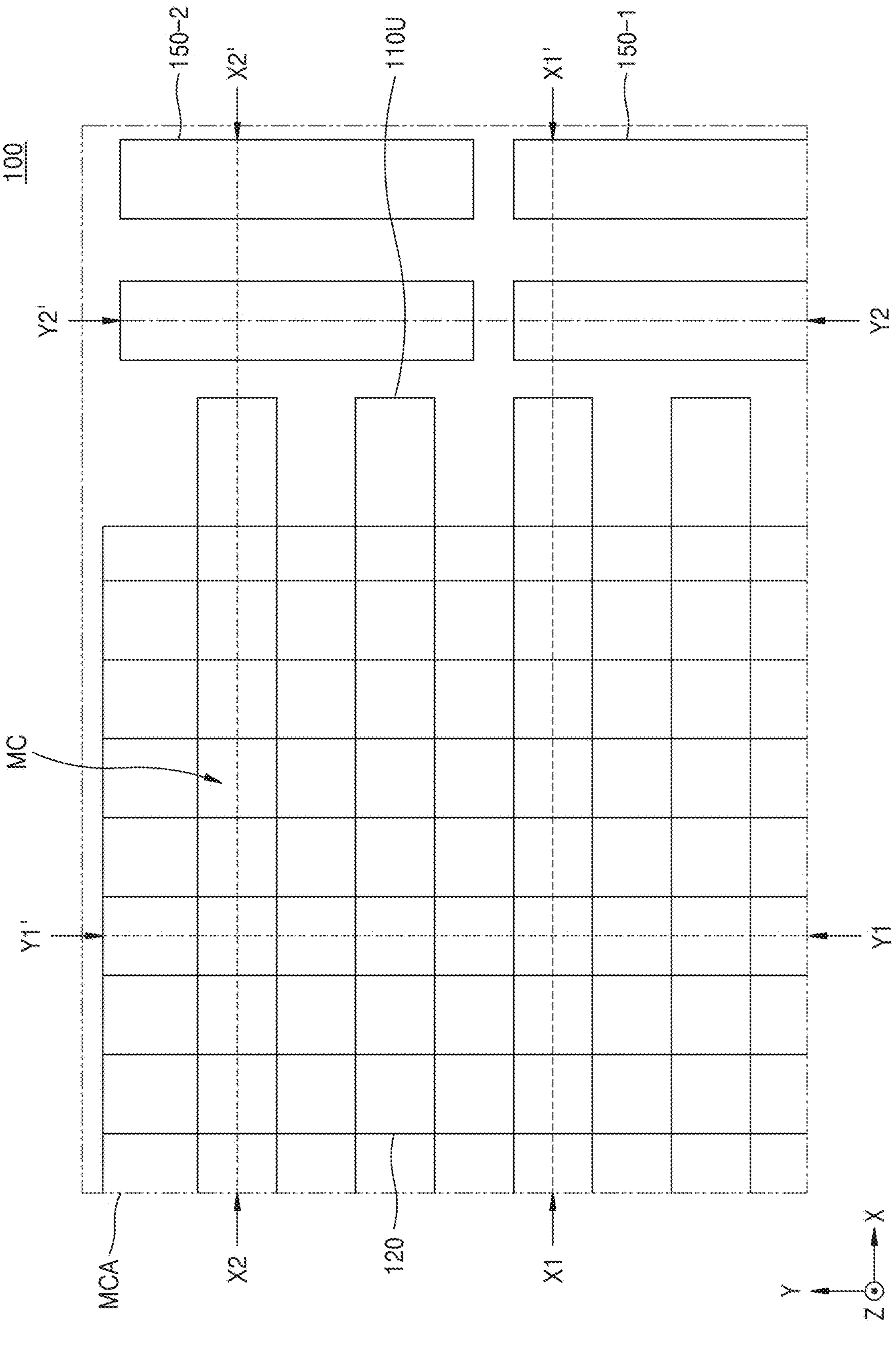
FIG. 3 is a schematic layout diagram of a memory device according to an embodiment.
Figure 4A:
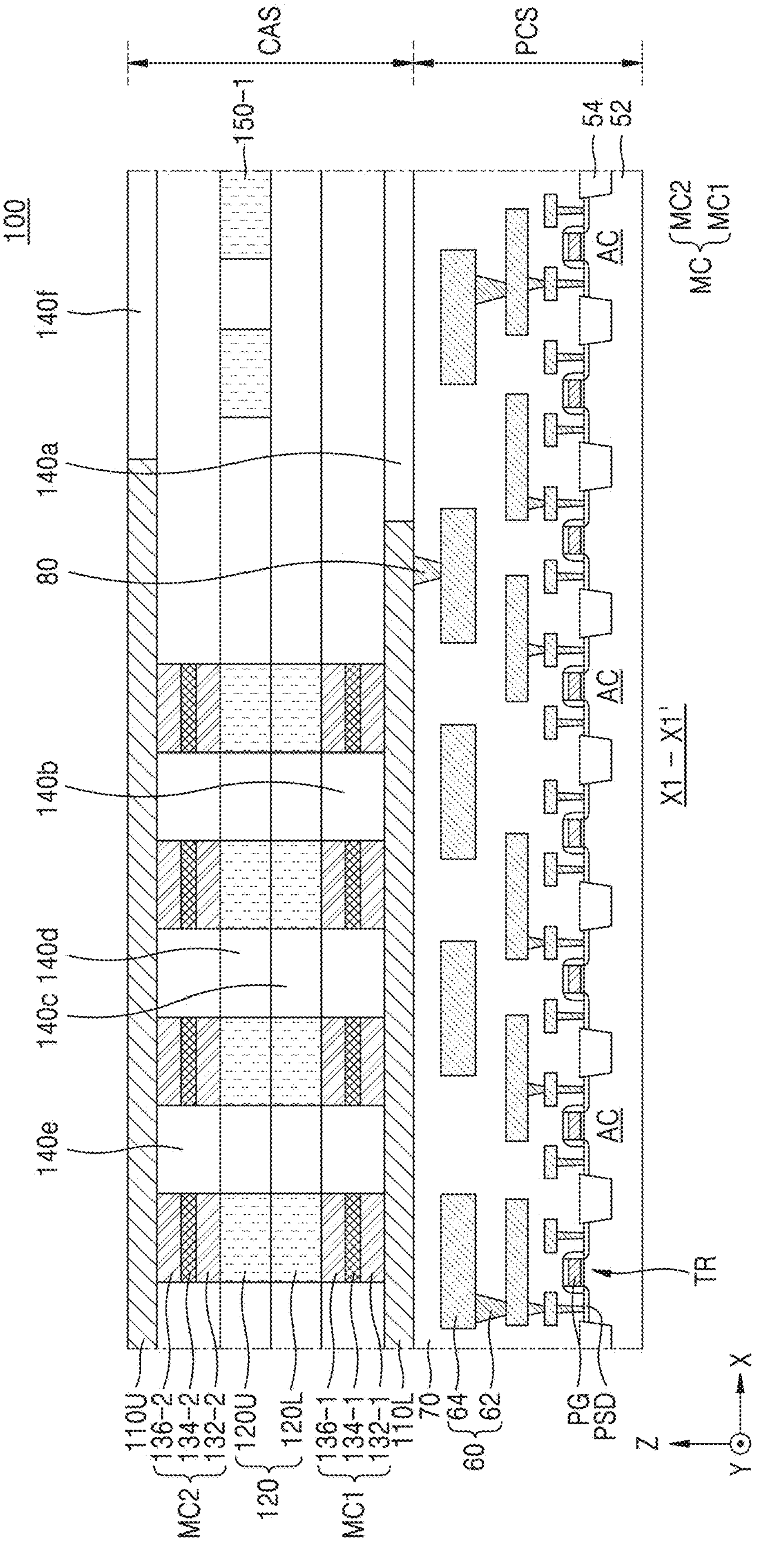
FIG. 4A is a cross-sectional view of the memory device of FIG. 3 taken along line X1-X1' in FIG. 3.
Figure 4B:
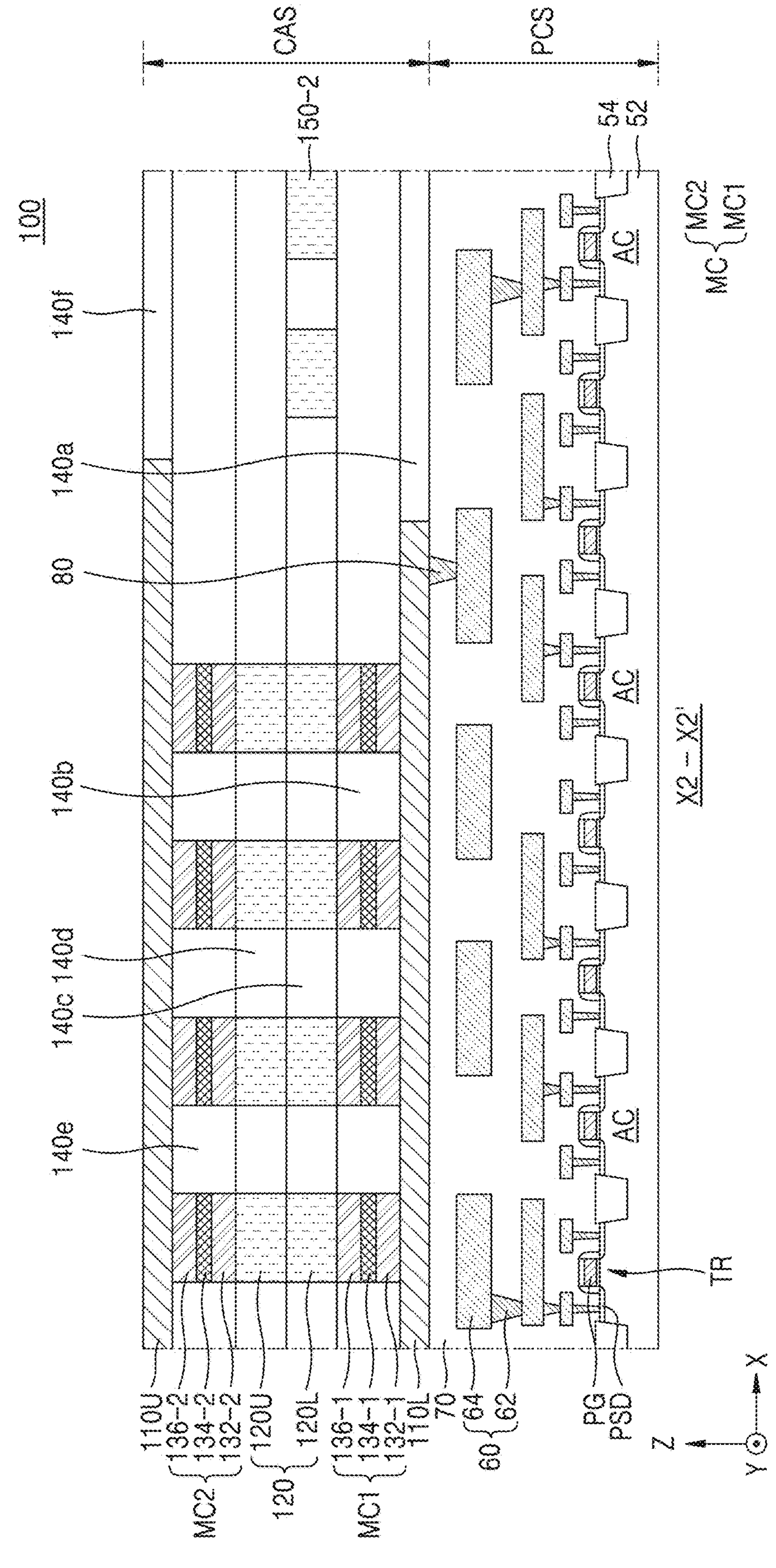
FIG. 4B is a cross-sectional view of the memory device of FIG. 3 taken along line X2-X2' in FIG. 3, according to an embodiment.
Figure 5A:
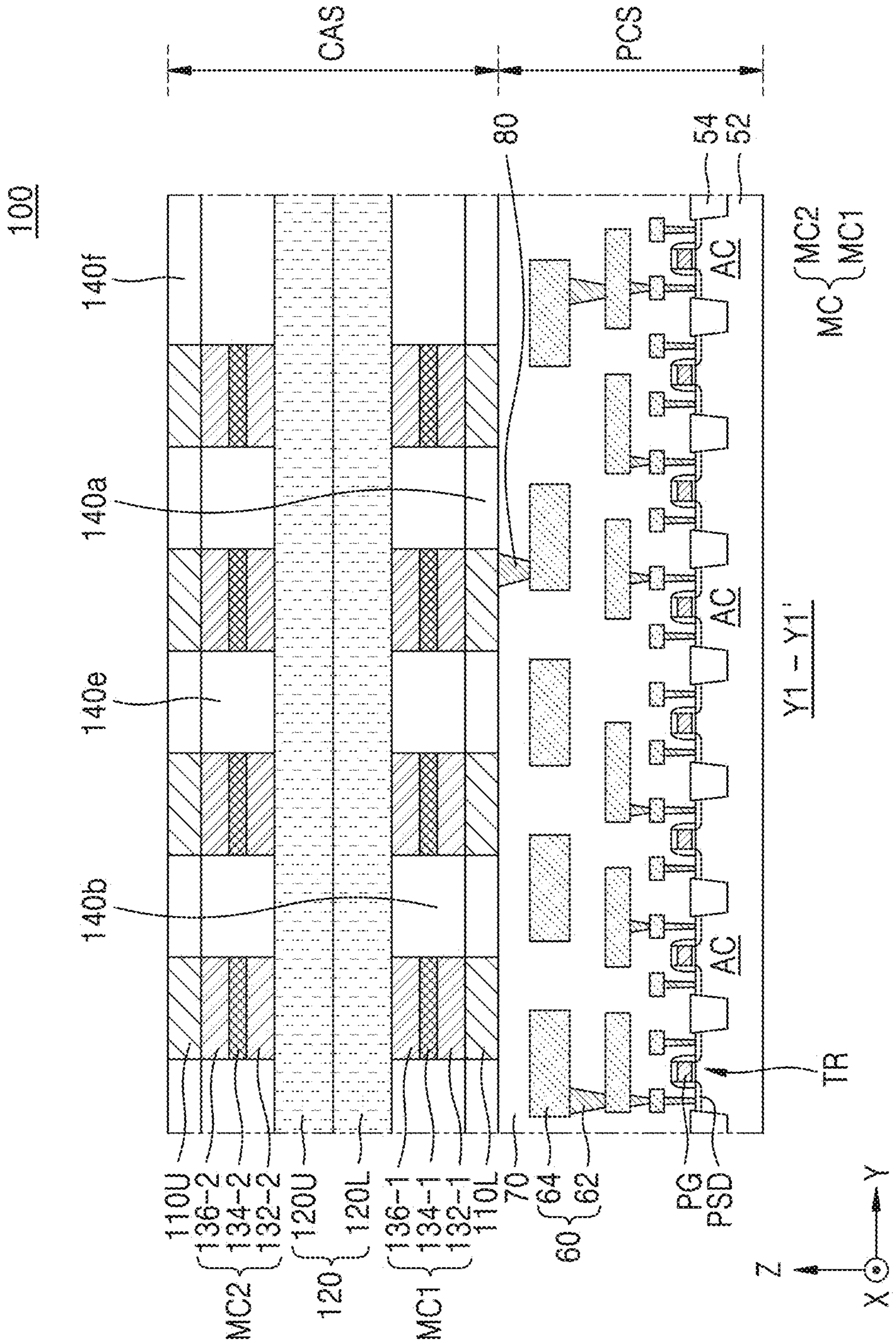
FIG. 5A is a cross-sectional view of the memory device of FIG. 3 taken along line Y1-Y1' in FIG. 3.
Figure 5B:
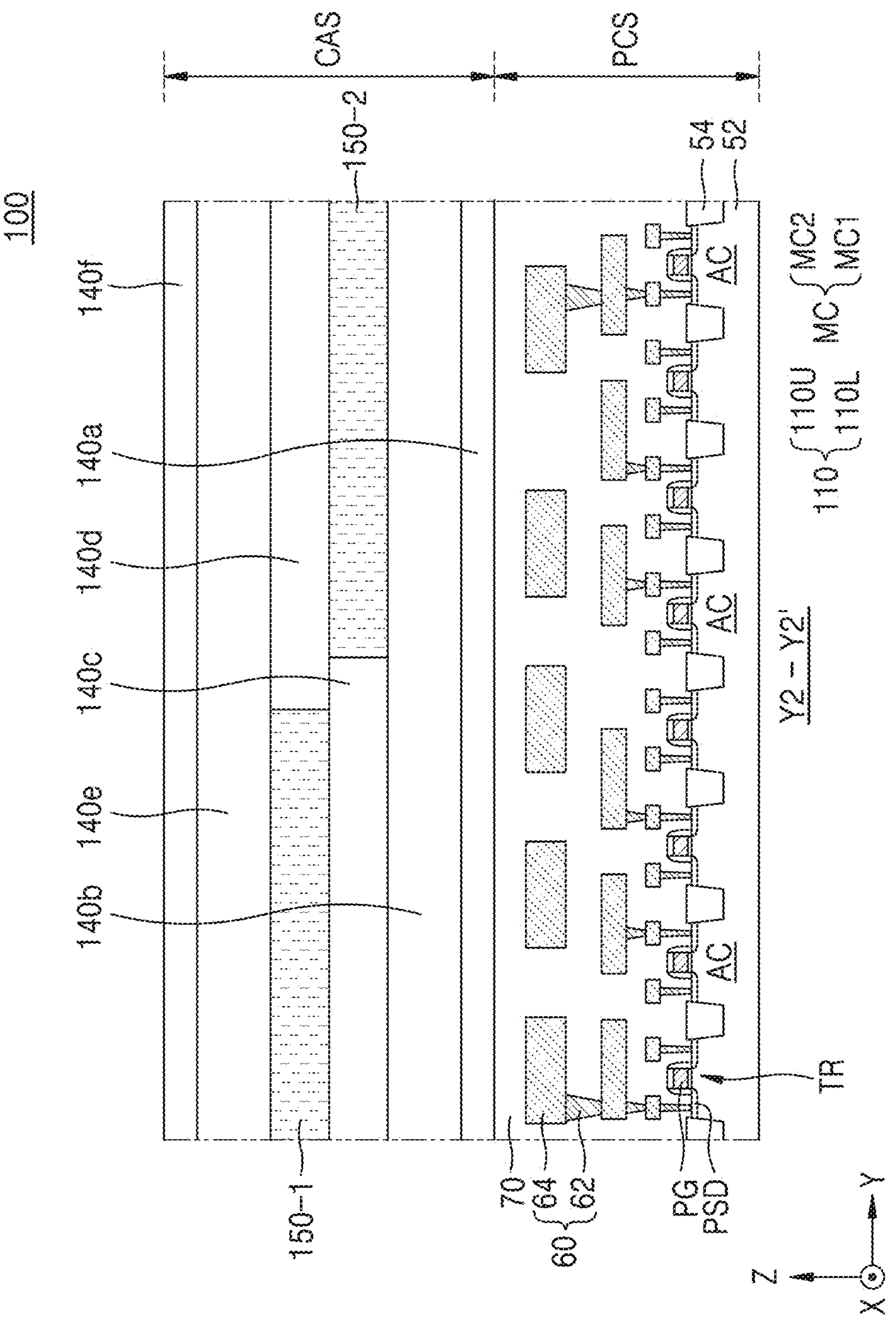
FIG. 5B is a cross-sectional view of the memory device of FIG. 3 taken along line Y2-Y2' in FIG. 3, according to an embodiment.
Figure 6:
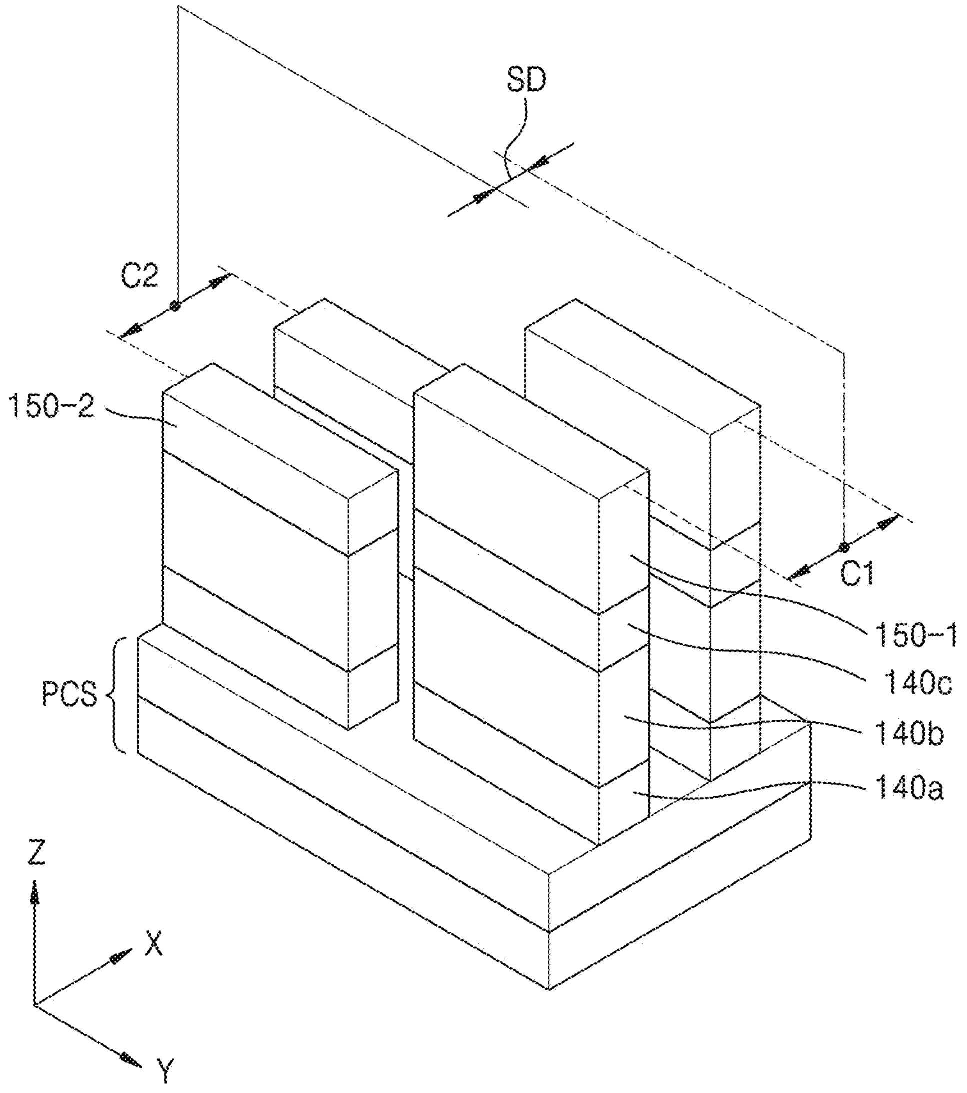
FIG. 6 is a perspective view of some components of a memory device, according to an embodiment.

FIG. 3 is a schematic layout diagram of a memory device 100 according to an embodiment. FIG. 4A is a cross-sectional view of the memory device 100 of FIG. 3 taken along line X1-X1' in FIG. 3, and FIG. 4B is a cross-sectional view of the memory device 100 of FIG. 3 taken along line X2-X2' in FIG. 3. FIG. 5A is a cross-sectional view of the memory device 100 of FIG. 3 taken along line Y1-Y1' in FIG. 3, and FIG. 5B is a cross-sectional view of the memory device 100 of FIG. 3 taken along line Y2-Y2' in FIG. 3. FIG. 6 is a perspective view of some components of the memory device 100, according to an embodiment.

Referring to FIGS. 3 through 6, the memory device 100 may include a plurality of cell array structures CAS arranged on a substrate 52. The plurality of cell array structures CAS may constitute the memory cell array MCA of the memory system 10 illustrated in FIG. 1.

A periphery circuit structure PCS may be arranged between the substrate 52 and the plurality of cell array structures CAS. The periphery circuit structure PCS may include the periphery circuit 30 described with reference to FIG. 2. The periphery circuit structure PCS may include a plurality of periphery circuit transistors TR formed on the upper surface of the substrate 52, and a periphery circuit wiring structure 60.

The plurality of periphery circuit transistors TR may include various circuits included in the periphery circuit 30 described with reference to FIG. 2. The plurality of periphery circuit transistors TR may further include unit devices, such as a resistor and a capacitor.

The substrate 52 may include a semiconductor substrate. For example, the substrate 52 may include Si, Ge, or SiGe. An active region AC may be defined by a device separation layer 54 in the substrate 52. The plurality of periphery circuit transistors TR may be formed on the active region AC. Each of the plurality of periphery circuit transistors TR may include a gate PG and a source/drain region PSD formed in the active region AC on both sides of the gate PG.

The periphery circuit wiring structure 60 may include a plurality of wiring lines 64 connected to the plurality of periphery circuit transistors TR and a plurality of wiring vias 62. At least some of the plurality of wiring lines 64 may be electrically connected to the plurality of periphery circuit transistors TR. The plurality of wiring vias 62 may be configured to interconnect some selected from the plurality of periphery circuit transistors TR and the plurality of wiring lines 64.

It is illustrated in FIGS. 4A through 5B that the periphery circuit wiring structure 60 includes three wiring layers in a vertical direction (Z direction), but embodiments are not limited thereto. For example, the periphery circuit wiring structure 60 may include two, three, four, or more than four wiring layers.

The plurality of periphery circuit transistors TR, the plurality of wiring lines 64, and the plurality of wiring vias 62 may be covered by a periphery circuit interlayer insulating layer 70. The periphery circuit interlayer insulating layer 70 may include silicon oxide, SiON, SiOCN, etc.

A plurality of contacts 80 may be configured to interconnect the periphery circuit wiring structure 60 to a first conductive line 110L of the cell array structure CAS. The plurality of contacts 80 may extend in the vertical direction (Z direction) into the periphery circuit interlayer insulating layer 70. The plurality of contacts 80 may completely overlap the first conductive line 110L of the cell array structure CAS in the vertical direction (Z direction).

The plurality of wiring lines 64, the plurality of wiring vias 62, and the plurality of contacts 80 may each include a metal, conductive metal nitride, metal silicide, or a combination thereof. For example, the plurality of wiring lines 64, the plurality of wiring vias 62, and the plurality of contacts 80 may each include conductive materials, such as tungsten, molybdenum, titanium, cobalt, tantalum, nickel, tungsten silicide, titanium silicide, cobalt silicide, tantalum silicide, and nickel silicide.

The cell array structure CAS may include a plurality of first conductive lines 110L on the substrate 52, a plurality of second conductive lines 120 on the first conductive lines 110L, and a plurality of third conductive lines 110U on the second conductive lines 120.

The plurality of first conductive lines 110L and the plurality of third conductive lines 110U may extend in parallel with each other in a first horizontal direction respectively (X direction). The third conductive line 110U may extend longer than the first conductive line 110L in the first horizontal direction (X direction). The first conductive line 110L and the third conductive line 110U are different from each other only in positions in the vertical direction (Z direction), but may be substantially the same as each other in extension directions or arrangement structures.

The plurality of second conductive lines 120 may extend in parallel with each other in a second horizontal direction (Y direction) crossing the first horizontal direction (X direction). In this case, the first horizontal direction (X direction) and the second horizontal direction (Y direction) may cross each other perpendicularly. The plurality of second conductive lines 120 may include a second lower conductive line 120L and a second upper conductive line 120U. The second lower conductive line 120L may be arranged on the first conductive line 110L, and the second upper conductive line 120U may be arranged on the second lower conductive line 120L. In this regard, the second lower conductive line 120L may be between the first conductive line 110L and the second upper conductive line 120U. In some embodiments, the second lower conductive line 120L may completely overlap the second upper conductive line 120U in the vertical direction (Z direction) perpendicular to the first horizontal direction (X direction) and the second horizontal direction (Y direction).

In some embodiments, the plurality of first conductive lines 110L and the plurality of third conductive lines 110U may constitute the plurality of word lines WL of the memory device 100, and the plurality of second conductive lines 120 may constitute the plurality of bit lines BL of the memory device 100. In this case, the plurality of first conductive lines 110L may constitute lower word lines, the plurality of third conductive lines 110U may constitute upper word lines, a plurality of second lower conductive lines 120L may constitute lower bit lines connected to the lower word lines, and a plurality of second upper conductive lines 120U may constitute upper bit lines connected to the upper word lines.

In other embodiments, the plurality of first conductive lines 110L and the plurality of third conductive lines 110U may constitute the plurality of bit lines BL of the memory device 100, and the plurality of second conductive lines 120 may constitute the plurality of word lines WL of the memory device 100.

In some embodiments, the plurality of first conductive lines 110L, the plurality of second conductive lines 120, and the plurality of third conductive lines 110U may each include a metal, metal nitride, or a combination thereof. For example, the plurality of first conductive lines 110L, the plurality of conductive lines 120, and the plurality of third conductive lines 110U may each include W, Ti, Ta, Al, Cu, C, CN, TiN, TiAlN, TiSiN, TiCN, TiCN, TiCSiN, WN, CoSiN, TaN, TaCN, TaCN, TaSiN, Au, Ag, Ir, Pt, Pd, Ru, Zr, Rh, Ni, Co, Cr, Sn, Zn, indium tin oxide ITO), an alloy thereof, or a combination thereof. In addition, the plurality of first conductive lines 110L, the plurality of second conductive lines 120, and the plurality of third conductive lines 110U may each further include a conductive barrier layer. The conductive barrier layer may include, for example, Ti, TiN, Ta, TaN, or a combination thereof.

In some embodiments, the second lower conductive line 120L and the second upper conductive line 120U may include the same material. For example, the second lower conductive line 120L and the second upper conductive line 120U may include W.

A plurality of first memory cells MC1 may be arranged at portions, where the plurality of first conductive lines 110L and the plurality of second lower conductive lines 120L cross each other, and a plurality of second memory cells MC2 may be arranged at portions, where the plurality of third conductive lines 110U and the plurality of second upper conductive lines 120U cross each other. The plurality of first memory cells MC1 may be spaced apart from each other horizontally, and the plurality of second memory cells MC2 may be spaced apart from each other horizontally. The plurality of first memory cells MC1 and the plurality of second memory cells MC2 may be formed in a pillar structure of rectangular pillars. However, embodiments are not limited thereto, and the plurality of first memory cells MC1 and the plurality of second memory cells MC2 may have various pillar shapes, for example, a circular pillar shape, an elliptical pillar shape, a polygonal pillar shape, etc.

The plurality of first memory cells MC1 and the plurality of second memory cells MC2 may each include lower electrode layers 132-1 and 132-2, switching material layers 134-1 and 134-2, and upper electrode layers 136-1 and 136-2, respectively.

The lower electrode layers 132-1 and 132-2 and the upper electrode layers 136-1 and 136-2 may function as a current path. The lower electrode layers 132-1 and 132-2 and the upper electrode layers 136-1 and 136-2 may include a conductive material. For example, the lower electrode layers 132-1 and 132-2 and the upper electrode layers 136-1 and 136-2 may each include a metal, conductive metal nitride, conductive metal oxide, or a combination thereof. For example, the lower electrode layers 132-1 and 132-2 and the upper electrode layers 136-1 and 136-2 may each include at least one selected from titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN), but are not limited thereto.

The switching material layers 134-1 and 134-2 may be arranged between the lower electrode layers 132-1 and 132-2 and the upper electrode layers 136-1 and 136-2. The switching material layers 134-1 and 134-2 may function as a self-select storage device. In this case, the self-select storage device may indicate a device capable of operating as both a select device and a storage device. Due to the characteristics of the switching material layers 134-1 and 134-2, the memory device 100 according to embodiments may be referred to as a selector-only memory (SOM).

The switching material layers 134-1 and 134-2 may include a chalcogenide alloy working as a self-select storage device and/or a chalcogenide material such as glass. The switching material layers 134-1 and 134-2 may respond to an applied voltage such as a program pulse. For example, in response to an applied voltage less than a threshold voltage, the switching material layers 134-1 and 134-2 may be maintained in an electrically non-conductive state, that is, an "off" state. In addition, in response to an applied voltage greater than the threshold voltage, the switching material layers 134-1 and 134-2 may be changed to an electrically conductive state, that is, an "on" state. The threshold voltage of the switching material layers 134-1 and 134-2 may be changed based on the polarity of the applied voltage. For example, the threshold voltage of the switching material layers 134-1 and 134-2 may be changed depending on whether the polarity of a program pulse is positive or negative. Accordingly, in the memory device 100, a bipolar voltage may be required for driving the memory device 100.

The switching material layers 134-1 and 134-2 may include, for example, indium (In)-antimony (Sb)-tellurium (Te) (IST), germanium (Ge)-antimony (Sb)-tellurium (Te) (GST), tellurium-antimony (As)-germanium (OTS), Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), sulfur(S), nitrogen (N), carbon (C), yttrium (Y), scandium (Sc), or a combination thereof. In this case, the IST may include, for example, $In_2Sb_2Te_5$, $InSb_2Te_4$, $InSb_4Te_7$, etc. The GST may include, for example, $Ge_8Sb_8Te_8$, $Ge_2Sb_2Te_5$, $GeSb_2Te_4$, $GeSb_4Te_7$, $Ge_4Sb_4Te_7$, etc. In some embodiments, the chalcogenide material may include glass or amorphous chalcogenide.

A first insulating layer 140$a$ may be arranged between each of the plurality of first conductive lines 110L, a third insulating layer 140$c$ may be arranged between each of the plurality of second lower conductive lines 120L, a fourth insulating layer 140$d$ may be arranged between each of the plurality of second upper conductive lines 120U, and a sixth insulating layer 140$f$ may be arranged between each of the plurality of third conductive lines 110U.

A second insulating layer 140$b$ may be arranged between each of the plurality of first memory cells MC1 including a lower electrode layer 132-1, a switching material layer 134-1, and an upper electrode layer 136-1, and a fifth insulating layer 140$c$ may be arranged between each of the plurality of second memory cells MC2 including a lower electrode layer 132-2, a switching material layer 134-2, and an upper electrode layer 136-2.

The first insulating layer 140$a$, the second insulating layer 140$b$, the third insulating layer 140$c$, the fourth insulating layer 140$d$, the fifth insulating layer 140$e$, and the sixth insulating layer 140$f$ may include, for example, a dielectric material of silicon oxide or silicon nitride, and may electrically separate devices of each layer from each other.

A plurality of first dummy patterns 150-1 and a plurality of second dummy patterns 150-2 may be horizontally spaced apart from a plurality of memory cells MC1, MC2 on the substrate 52. A region on the substrate 52, where the plurality of first dummy patterns 150-1 and the plurality of second dummy patterns 150-2 are arranged, may include a dummy region where the memory cells MC1, MC2 are not arranged. For example, the dummy region may be offset from the memory cells MC1, MC2. The plurality of first dummy patterns 150-1 and the plurality of second dummy patterns 150-2 may extend in parallel with each other in an extension direction respectively (that is, the second horizontal direction (Y direction). The first dummy pattern 150-1 and the second dummy pattern 150-2 may face each other in the second horizontal direction (Y direction). The first dummy pattern 150-1 may not overlap the second dummy pattern 150-2 in the vertical direction (Z direction). In some embodiments, the first dummy pattern 150-1 and the second dummy pattern 150-2 may be spaced apart from each other in the second horizontal direction (Y direction).

In some embodiments, the first dummy pattern 150-1 and the second dummy pattern 150-2 may be on different vertical levels from each other. For example, the first dummy pattern 150-1 may be at a higher vertical level (i.e., farther from the substrate 52) than the second dummy pattern 150-2. In this case, the first dummy pattern 150-1 may be arranged on the third insulating layer 140$c$ to be substantially at the same vertical level as the second upper conductive line 120U, and the second dummy pattern 150-2 may be arranged on the second insulating layer 140$b$ to be substantially at the same vertical level as the second lower conductive line 120L. In addition, sidewalls of the first dummy pattern 150-1 may be surrounded by the fourth insulating layer 140$d$, an upper surface of the first dummy pattern 150-1 may be covered by the fifth insulating layer 140$c$, sidewalls of the second dummy pattern 150-2 may be surrounded by the third insulating layer 140$c$, and an upper surface of the second dummy pattern 150-2 may be covered by the fourth insulating layer 140$d$. In addition, a lower surface of the first dummy pattern 150-1, the upper surface of the second dummy pattern 150-2, and a lower surface of the fourth insulating layer 140$d$ may be on the same flat surface (i.e., may extend along a common plane).

In some embodiments, the plurality of first dummy patterns 150-1 may have substantially the same arrangement structure as the plurality of second upper conductive lines 120U, and the plurality of second dummy patterns 150-2 may have substantially the same arrangement structure as the plurality of second lower conductive lines 120L.

In some embodiments, a pitch between each of the plurality of first dummy patterns 150-1 may be the same as a pitch between each of the plurality of second upper conductive lines 120U, and a pitch of the plurality of second dummy patterns 150-2 may be the same as a pitch between each of the plurality of second lower conductive lines 120L.

In some embodiments, a horizontal width (X direction length) of each of the plurality of first dummy patterns 150-1 may be the same as a horizontal width (X direction length) of each of the second upper conductive line 120U, and a horizontal width (X direction length) of each of the plurality of second dummy patterns 150-2 may be the same as a horizontal width (X direction length) of each of the second lower conductive line 120L.

In some embodiments, the plurality of first dummy patterns 150-1 may have substantially the same shape as the plurality of second upper conductive lines 120U, and the plurality of second dummy patterns 150-2 may have substantially the same shape as the plurality of second lower conductive lines 120L. For example, the plurality of first dummy patterns 150-1, the plurality of second dummy patterns 150-2, and the plurality of second upper conductive lines 120U, and the plurality of second lower conductive lines 120L may each have a rectangular shape in a plan view.

In some embodiments, the plurality of first dummy patterns 150-1 may include the same material as the plurality of second upper conductive lines 120U, and the plurality of second dummy patterns 150-2 may include the same material as the plurality of second lower conductive lines 120L. For example, the plurality of first dummy patterns 150-1, the plurality of second dummy patterns 150-2, the plurality of second upper conductive lines 120U, and the plurality of second lower conductive lines 120L may each include W.

The memory device 100 according to embodiments may include the first dummy pattern 150-1 and the second dummy pattern 150-2. In this case, the first dummy pattern 150-1 and the second dummy pattern 150-2 may each have substantially the same arrangement structure as the second upper conductive line 120U and the second lower conductive line 120L, respectively, but the first dummy pattern 150-1 may not overlap the second dummy pattern 150-2, unlike the second upper conductive line 120U and the second lower conductive line 120L. Accordingly, by using an electronic microscope, an image of each of the first dummy pattern 150-1 and the second dummy pattern 150-2 may be obtained, and by using the image of each of the first dummy pattern 150-1 and the second dummy pattern 150-2, the misalignment between the second upper conductive line 120U and the second lower conductive line 120L may be measured and corrected. Thus, the structural reliability of the memory device 100 may be improved. Hereinafter, the misalignment measurement between the second upper conductive line 120U and the second lower conductive line 120L by using the first dummy pattern 150-1 and the second dummy pattern 150-2 is described in more detail with reference to FIG. 7.

Figure 7:
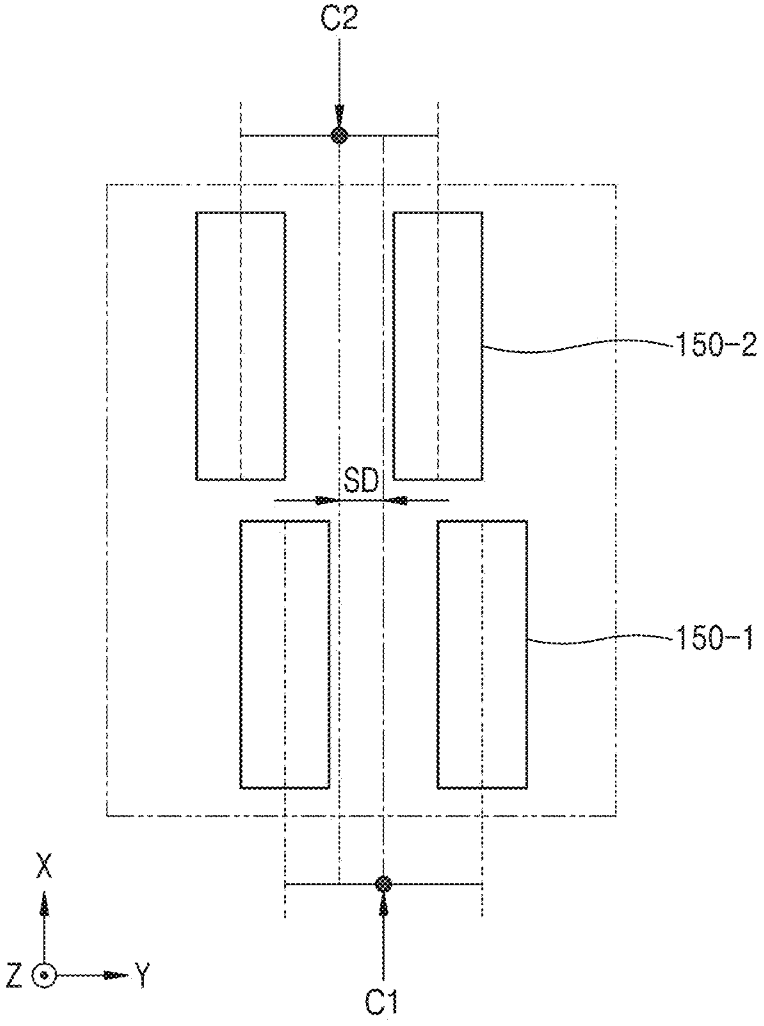
FIG. 7 is a diagram illustrating a misalignment measurement method between a second upper conductive line and a second lower conductive line respectively using a first dummy pattern and a second dummy pattern, according to an embodiment.

FIG. 7 is a diagram describing the misalignment measurement method between the second upper conductive line (refer to 120U in FIG. 4A) and the second lower conductive line (refer to 120L in FIG. 4A) by using the first dummy pattern 150-1 and the second dummy pattern 150-2. In FIG.

7, for describing the misalignment measurement method, the case, in which the second upper conductive line 120U and the second lower conductive line 120L are misaligned with each other, is assumed.

Referring to FIG. 7, because the first dummy pattern 150-1 does not overlap the second dummy pattern 150-2 in the vertical direction (Z direction) as described above, an image of each of the first dummy pattern 150-1 and the second dummy pattern 150-2 may be obtained. By using the images, a center point C1 between two adjacent first dummy patterns 150-1 along the second horizontal direction (Y direction) and a center point C2 between two adjacent second dummy patterns 150-2 along the second horizontal direction (Y direction) may be calculated, and by using the center points C1 and C2, a separation distance SD along the second horizontal direction (Y direction) between the center points C1 and C2 may be measured. Because the first dummy pattern 150-1 and the second dummy pattern 150-2 have the same arrangement structure as the second upper conductive line 120U and the second lower conductive line 120L, respectively, the separation distance SD may be identical to a separation distance between the second upper conductive line 120U and the second lower conductive line 120L, that is, the degree of misalignment. Accordingly, by correcting the measured separation distance SD, the misalignment between the second upper conductive line 120U and the second lower conductive line 120L may be improved, and the reliability of the memory device 100 may be improved.

Figure 8:
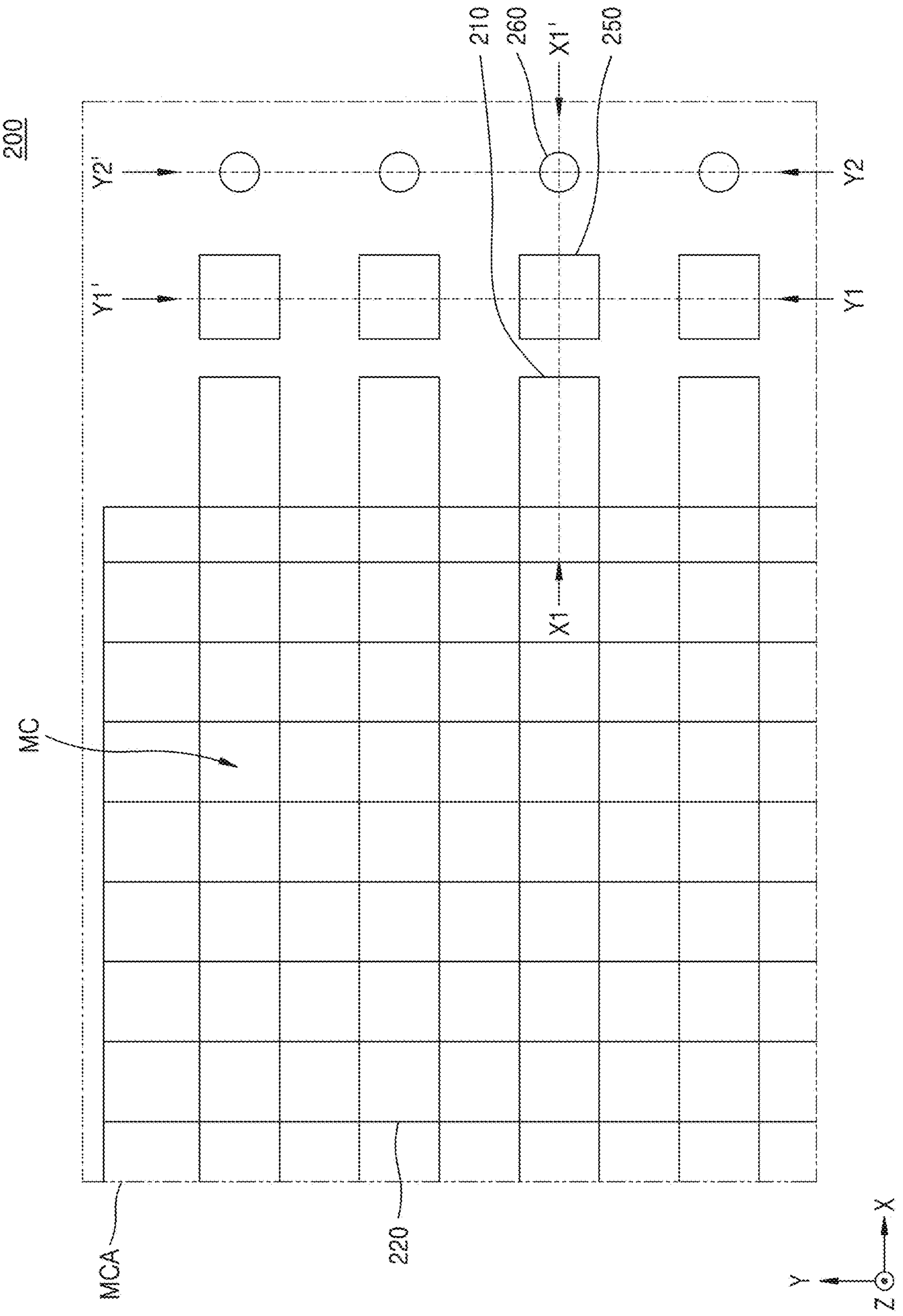
FIG. 8 is a schematic layout diagram of a memory device according to an embodiment.
Figure 9:
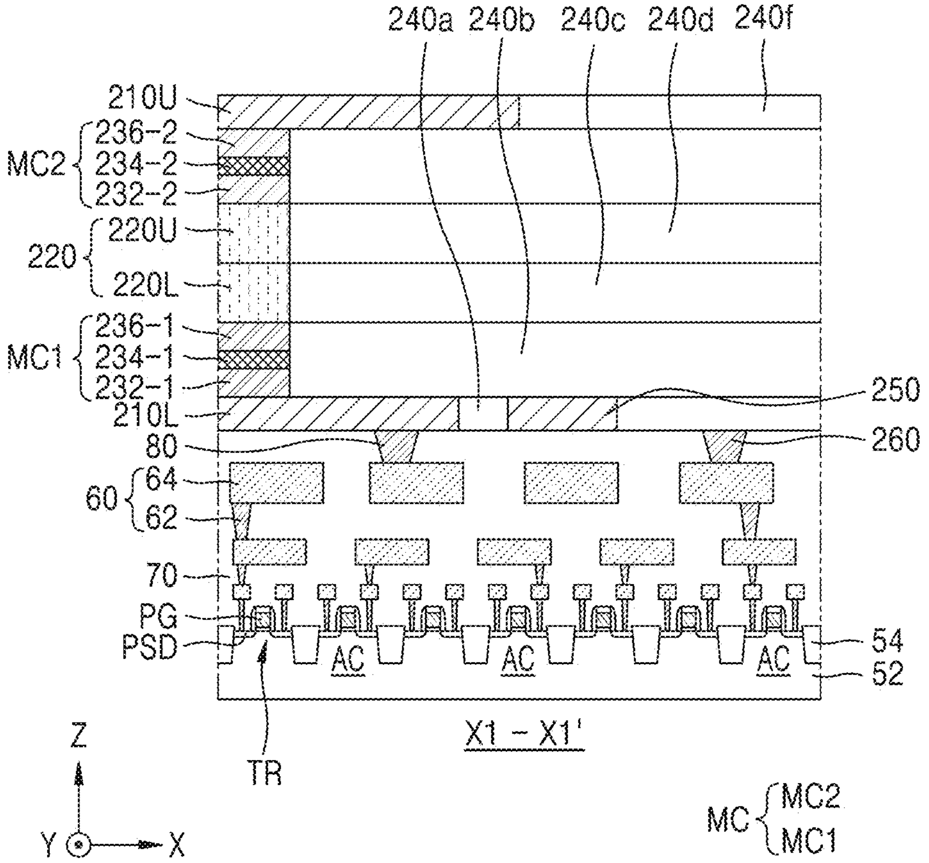
FIG. 9 is a cross-sectional view of the memory device of FIG. 8 taken along line X1-X1' in FIG. 8, according to an embodiment.
Figure 10A:
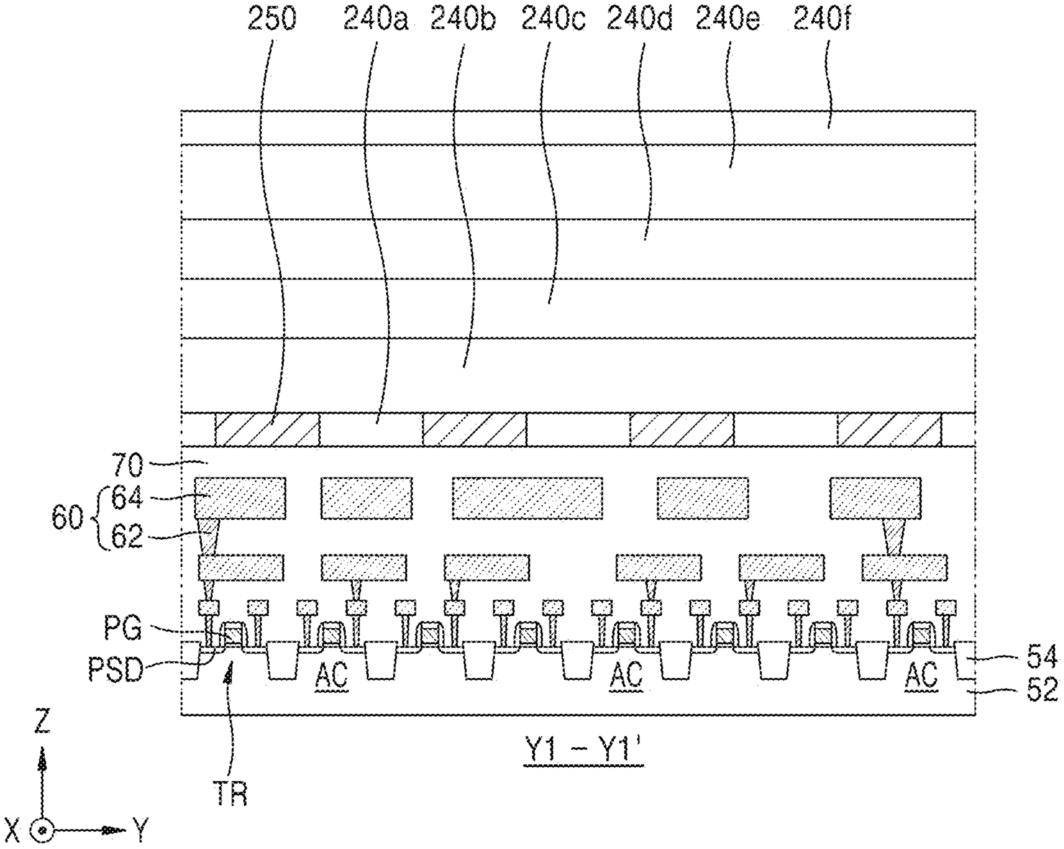
FIG. 10A is a cross-sectional view of the memory device of FIG. 8 taken along line Y1-Y1' in FIG. 8.
Figure 10B:
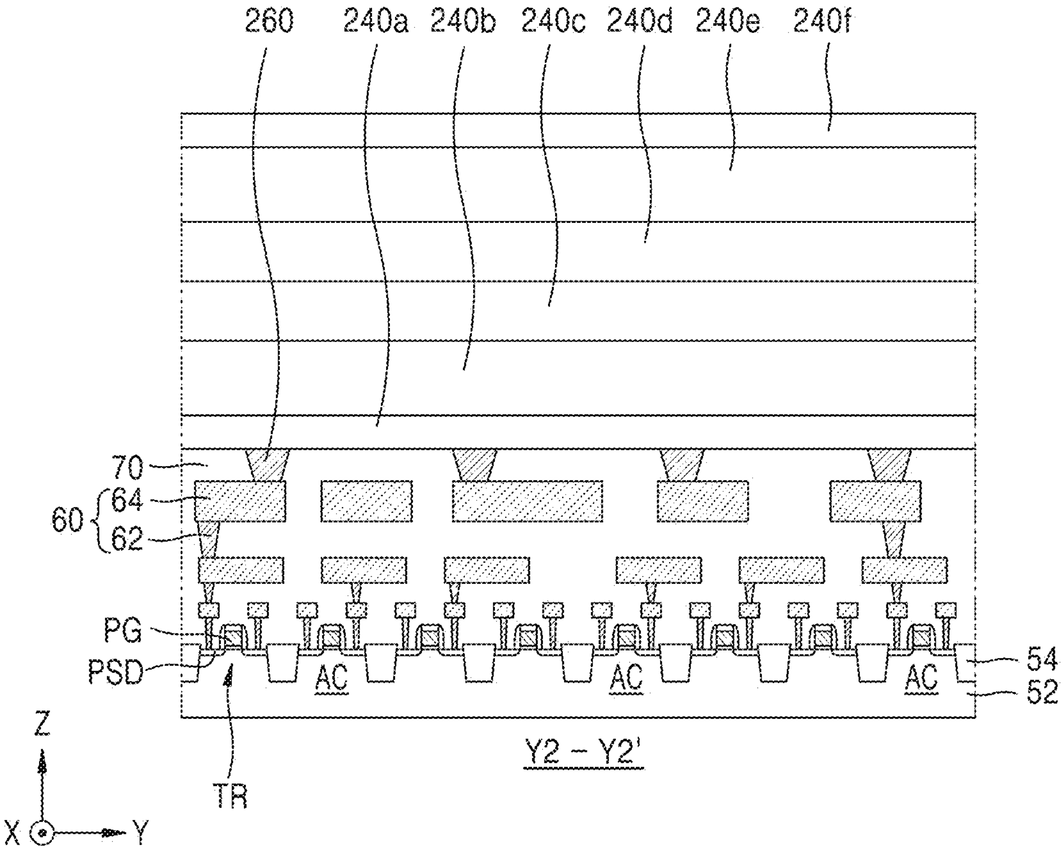
FIG. 10B is a cross-sectional view of the memory device of FIG. 8 taken along line Y2-Y2' in FIG. 8, according to an embodiment.

FIG. 8 is a schematic layout diagram of a memory device 200 according to an embodiment. FIG. 9 is a cross-sectional view of the memory device 200 of FIG. 8 taken along line X1-X1' in FIG. 8. FIG. 10A is a cross-sectional view of the memory device 200 of FIG. 8 taken along line Y1-Y1' in FIG. 8, and FIG. 10B is a cross-sectional view of the memory device 200 of FIG. 8 taken along line Y2-Y2' in FIG. 8. Because components of the memory device 200 illustrated in FIG. 8 through 10B (PCS, 80, 210L, 220L, 220U, 220L, 210U, 232-1, 234-1, 236-1, 232-2, 234-2, 236-2, 240*a*, 240*b*, 240*c*, 240*d*, 240*c*, and 240*f*) may be substantially the same as the components of the memory device 100 described with reference to FIGS. 3 through 6 (PCS, 80, 210L, 220L, 220U, 210U, 232-1, 234-1, 236-1, 232-2, 234-2, 236-2, 240*a*, 240*b*, 240*c*, 240*d*, 240*c*, and 240*f*), respectively, hereinafter, descriptions are given mainly based on differences therebetween.

Referring to FIGS. 8 through 10B, the memory device 200 may include a plurality of dummy patterns 250 and a plurality of dummy contacts 260. The plurality of dummy patterns 250 and the plurality of dummy contacts 260 may be spaced apart from the plurality of memory cells MC1, MC2 horizontally on the substrate 52. A region on the substrate 52, where the plurality of dummy patterns 250 and the plurality of dummy contacts 260 are arranged, may include a dummy region where the memory cells MC1, MC2 are not arranged. The plurality of dummy patterns 250 may extend in parallel with each other in an extension direction of the first conductive line 110L (that is, the first horizontal direction (X direction)). The plurality of dummy contacts 260 may be arranged in the second horizontal direction (Y direction). The dummy patterns 250 and the dummy contacts 260 may face each other, respectively, in the first horizontal direction (X direction). The dummy patterns 250 may not overlap the dummy contacts 260 in the vertical direction (Z direction). In some embodiments, the dummy patterns 250 may be spaced apart from the dummy contacts 260 in the first horizontal direction (X direction).

In some embodiments, the dummy patterns 250 and the dummy contacts 260 may be at different vertical levels from each other. For example, the dummy patterns 250 may be at a higher vertical level (i.e., farther from the substrate 52) than the dummy contact 260. In this case, the dummy patterns 250 may be substantially at the same vertical level as the first conductive lines 110L, and the dummy contacts 260 may be substantially at the same vertical level as the contacts 80. In addition, sidewalls of the dummy pattern 250 may be surrounded by a first insulating layer 240*a* and an upper surface of the dummy pattern 250 may be covered by a second insulating layer 240*b*, and sidewalls of the dummy contact 260 may be surrounded by the periphery circuit interlayer insulating layer 70 and an upper surface of the dummy contact 260 may be covered by the first insulating layer 240*a*. In addition, a lower surface of the dummy pattern 250, an upper surface of the dummy contact 260, and a lower surface of the first insulating layer 240*a* may be on the same flat surface.

In some embodiments, the plurality of dummy patterns 250 may have substantially the same arrangement structure as the plurality of first conductive lines 110L, and the plurality of dummy contacts 260 may have substantially the same arrangement structure as the plurality of contacts 80.

In some embodiments, a pitch between the plurality of dummy patterns 250 may be the same as a pitch between the plurality of first conductive lines 110L, and a pitch between the plurality of dummy contacts 260 may be the same as a pitch between the plurality of contacts 80.

In some embodiments, a horizontal width (Y direction length) of each of the plurality of dummy patterns 250 may be the same as a horizontal width (Y direction length) of each of the plurality of first conductive lines 110L. In some embodiments, a horizontal area of each of the plurality of dummy contacts 260 may be the same as a horizontal area of each of the plurality of contacts 80.

In some embodiments, the plurality of dummy patterns 250 may have substantially the same shape as the plurality of first conductive lines 110L, and the plurality of dummy contacts 260 may have substantially the same shape as the plurality of contacts 80. For example, the plurality of dummy patterns 250 and the plurality of first conductive lines 110L may each have a rectangular shape in a plan view, and the plurality of dummy contacts 260 and the plurality of contacts 80 may each have a circular shape in a plan view.

In some embodiments, the plurality of dummy patterns 250 and the plurality of first conductive lines 110L may include the same material, and the plurality of dummy contacts 260 and the plurality of contacts 80 may include the same material. For example, the plurality of dummy patterns 250, the plurality of first conductive lines 110L, the plurality of dummy contacts 260, and the plurality of contacts 80 may include W.

The memory device 200 according to embodiments may include the dummy pattern 250 and the dummy contact 260. In this case, the dummy patterns 250 and the dummy contacts 260 may have substantially the same arrangement structure as the first conductive lines 110L and the contacts 80, respectively, but may not overlap each other, unlike the first conductive lines 110L and the contacts 80. Accordingly, by using an electronic microscope, an image of each of the dummy pattern 250 and the dummy contact 260 may be obtained, and by using the image of each of the dummy pattern 250 and the dummy contact 260, the misalignment between a first conductive line 110L and a contact 80 may be measured and corrected. Thus, the structural reliability of the memory device 200 may be improved. Hereinafter, the misalignment measurement between the first conductive line 110L and the contact 80 by using the dummy pattern 250 and the dummy contact 260 is described in more detail with reference to FIG. 11.

Figure 11:
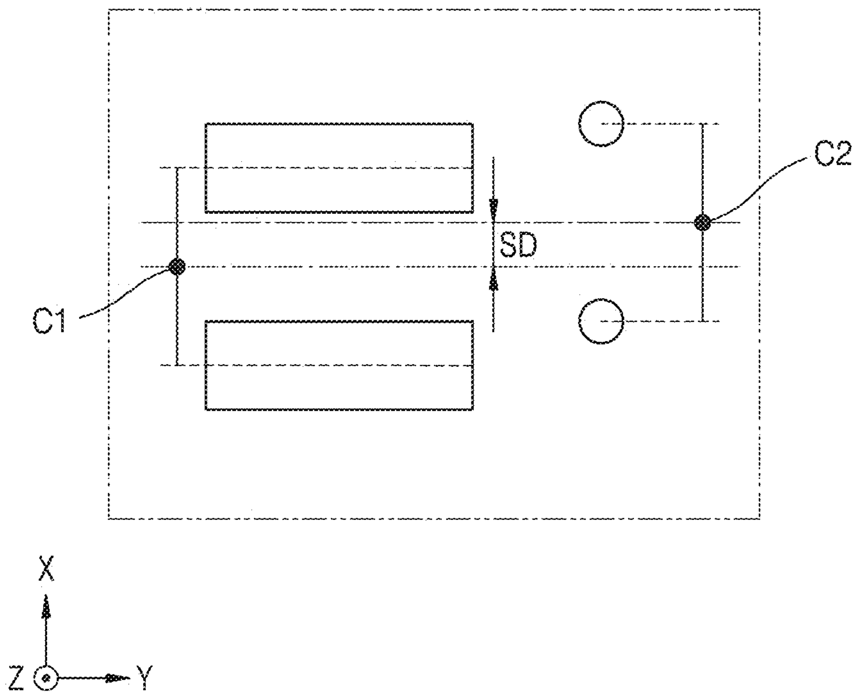
FIG. 11 is a diagram illustrating the misalignment measurement method between a first conductive line and a contact by using a dummy pattern and a dummy contact.

FIG. 11 is a diagram for describing the misalignment measurement method between the first conductive line 110L and the contact 80 by using the dummy pattern 250 and the dummy contact 260. In FIG. 11, for describing the misalignment measurement method, the case, in which the first conductive line 110L and the contact 80 are misaligned with each other, is assumed.

Referring to FIG. 11, because the dummy pattern 250 does not overlap the dummy contact 260 in the vertical direction (Z direction), an image of each of the dummy pattern 250 and the dummy contact 260 may be obtained. By using the images, the center point C1 along the first horizontal direction (X direction) between two adjacent dummy patterns 250 and the center point C2 along the first horizontal direction (X direction) between two adjacent dummy contacts 260 may be calculated, and by using the center points C1 and C2, the separation distance SD along the first horizontal direction (X direction) between the center points C1 and C2 may be measured. Because the dummy pattern 250 and the dummy contact 260 have the same arrangement structure as the first conductive line 110L and the contact 80, respectively, the separation distance SD may coincide with a separation distance, that is, the degree of misalignment, between the first conductive line 110L and the contact 80. Accordingly, by correcting the measured separation distance SD, the misalignment between the first conductive line 110L and the contact 80 may be improved, and the reliability of the memory device 200 may be improved.

FIGS. 12A, 12B, 13A, 13B, 14A, 14B, 14C, 14D, 15A, 15B, 15C, 15D, 16A, 16B, 16C, 16D, 17A, 17B, 17C, and 17D are cross-sectional views describing a manufacturing method of a memory device, according to embodiments. FIGS. 12A, 13A, 14A, 15A, 16A, and 17A are cross-sectional views taken along line X1-X1' in FIG. 3, FIGS. 14B, 15B, 16B, and 17B are cross-sectional views taken along line X2-X2' in FIG. 3, FIGS. 12B, 13B, 14C, 15C, 16C, and 17C are cross-sectional views taken along line Y1-Y1' in FIG. 3, and FIGS. 14D, 15D, 16D, and 17D are cross-sectional views taken along line Y2-Y2' in FIG. 3.

Figure 12A:
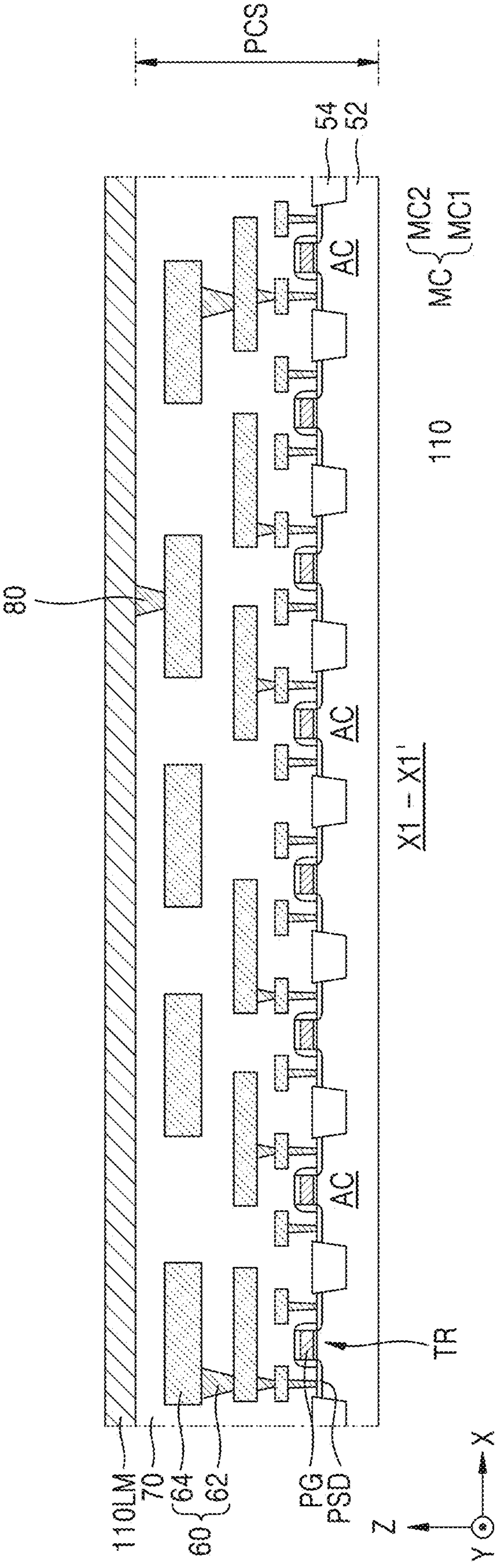
FIGS. 12A, 12B, 13A, 13B, 14A, 14B, 14C, 14D, 15A, 15B, 15C, 15D, 16A, 16B, 16C, 16D, 17A, 17B, 17C, and 17D are cross-sectional views describing a manufacturing method of a memory device, according to embodiments.
Figure 12B:
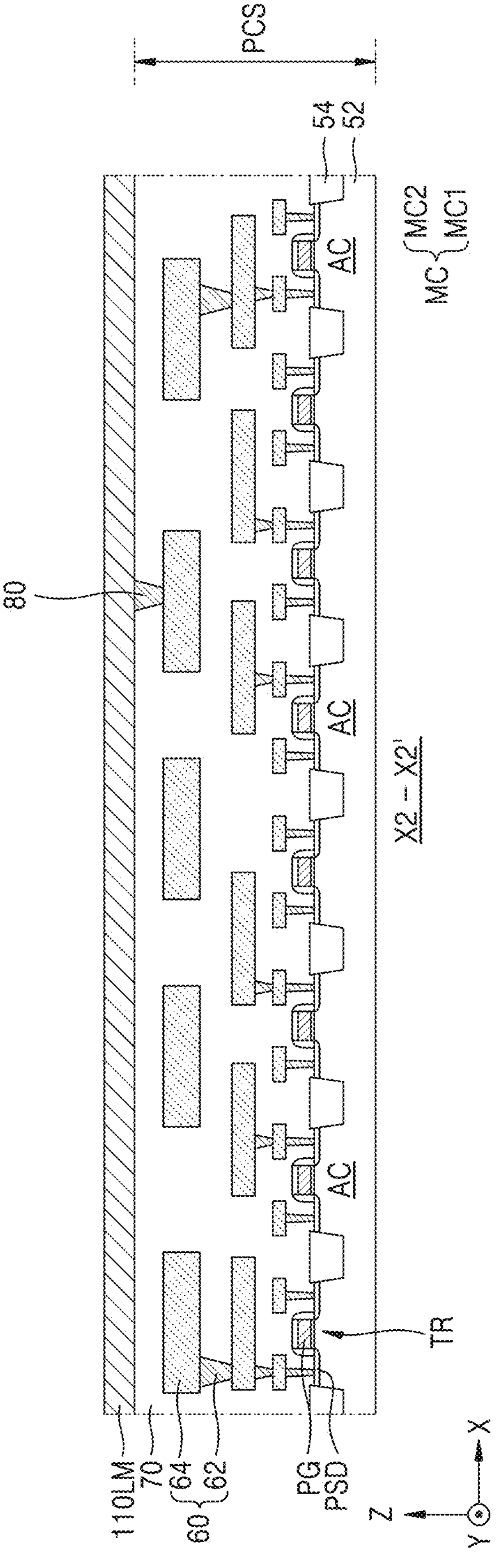

Referring to FIGS. 12A and 12B, the periphery circuit structure PCS may be formed on the substrate 52, and a first conductive material layer 110LM may be formed on the periphery circuit structure PCS. The material of the first conductive material layer 110LM may be substantially the same as the material of the first conductive line 110L described with reference to FIG. 6.

Figure 13A:
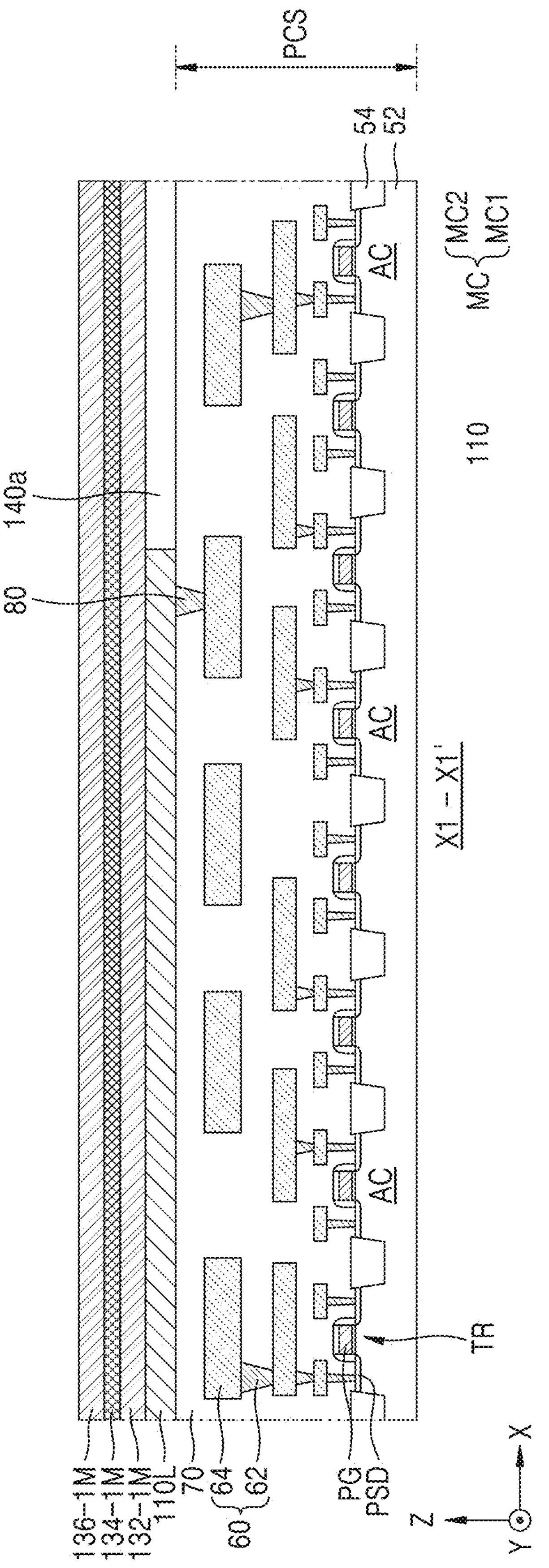
Figure 13B:
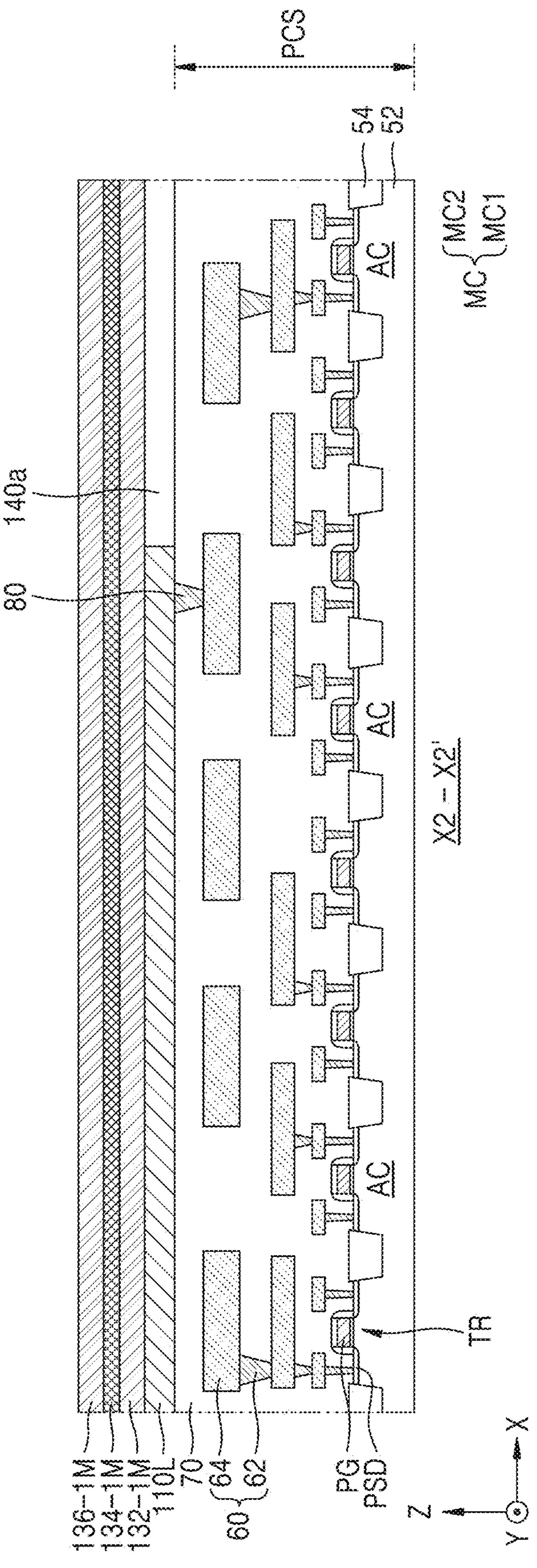
Figure 14A:
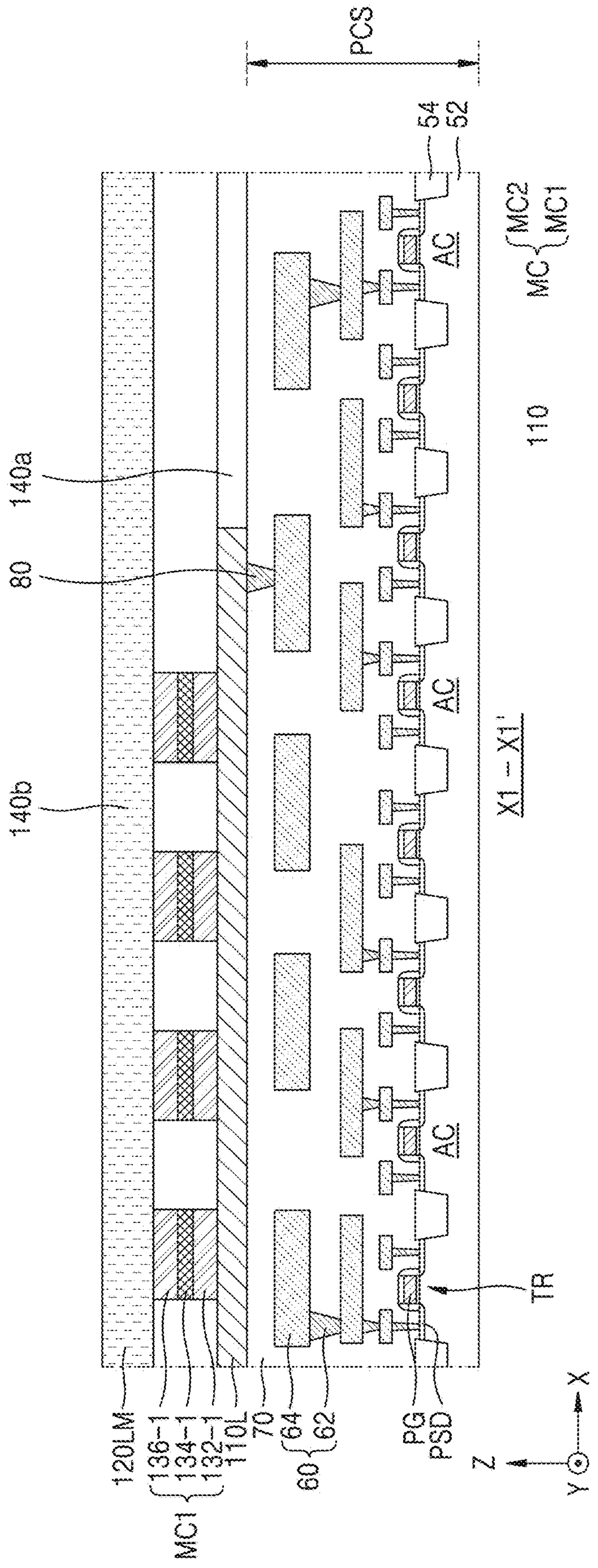
Figure 14B:
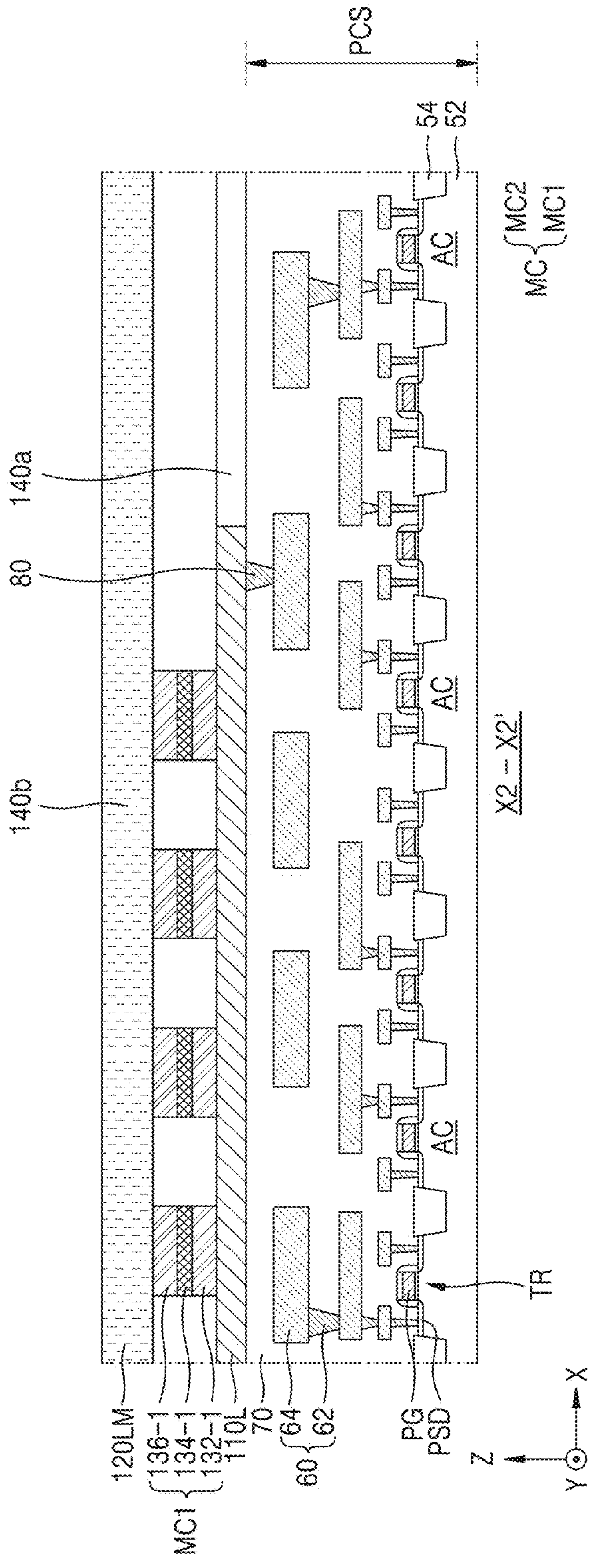
Figure 14C:
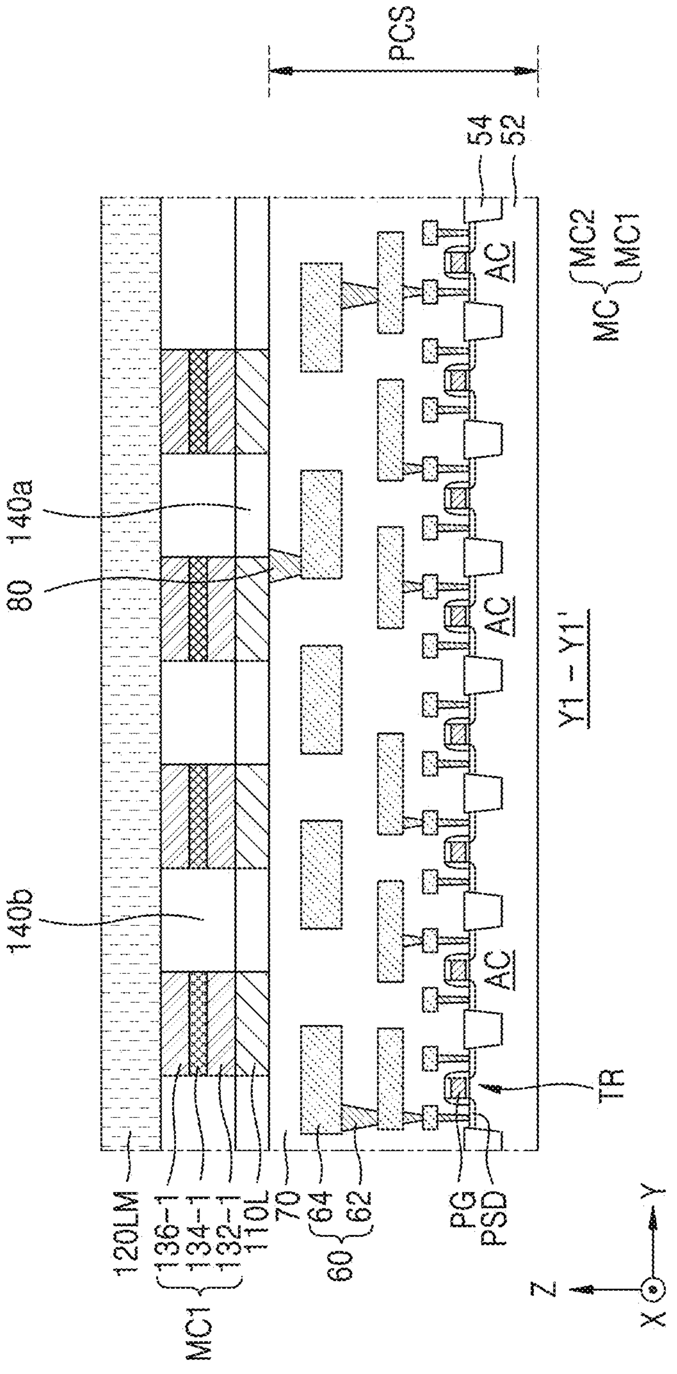
Figure 14D:
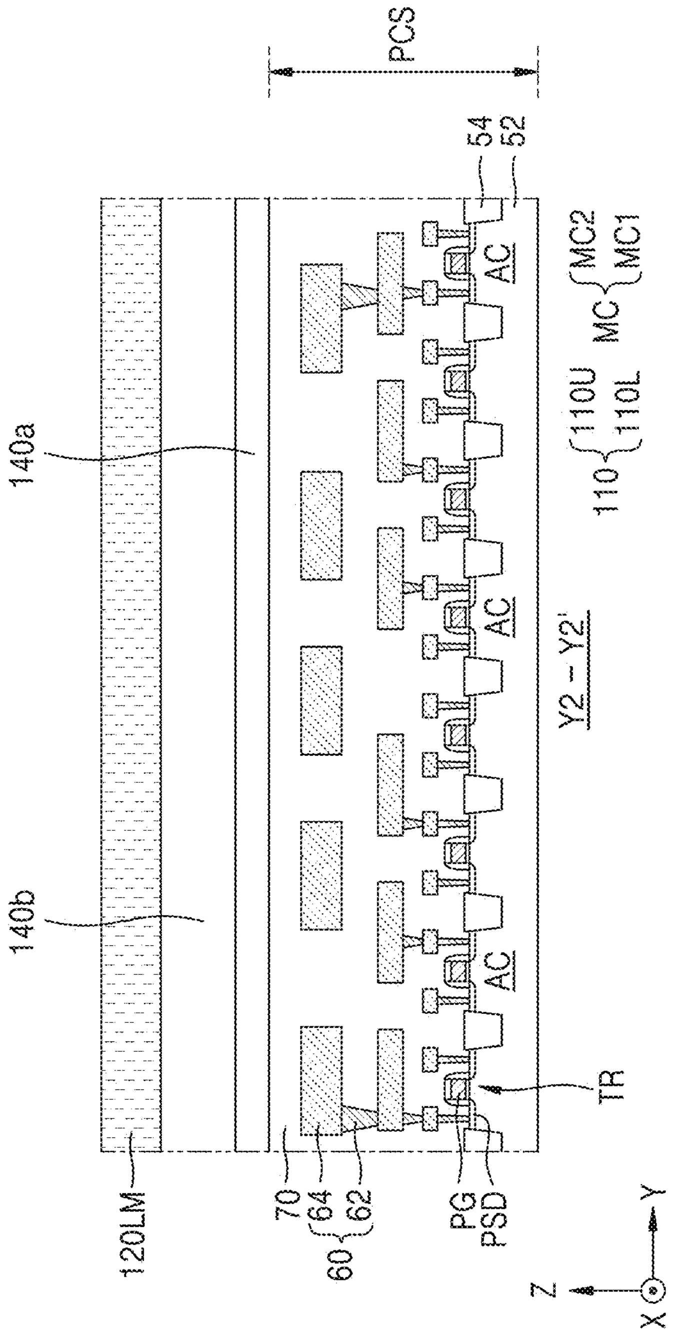
Figure 15A:
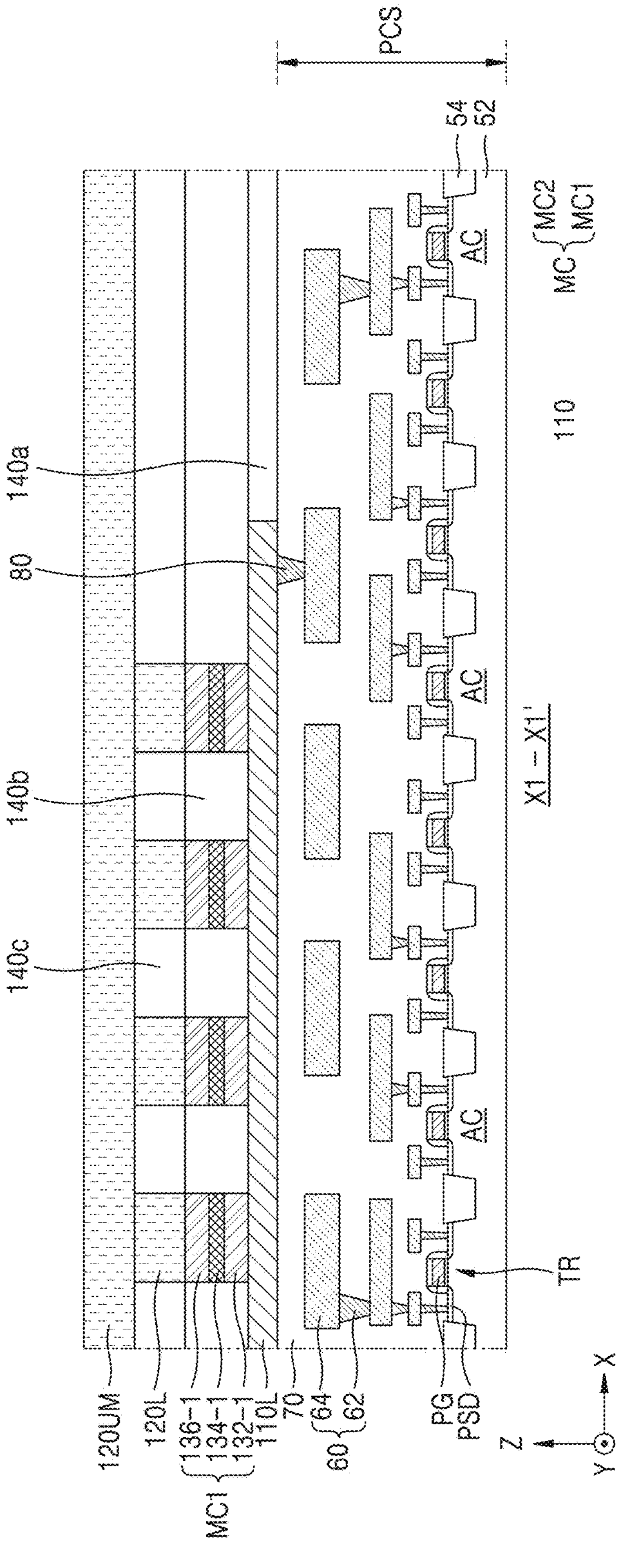
Figure 15B:
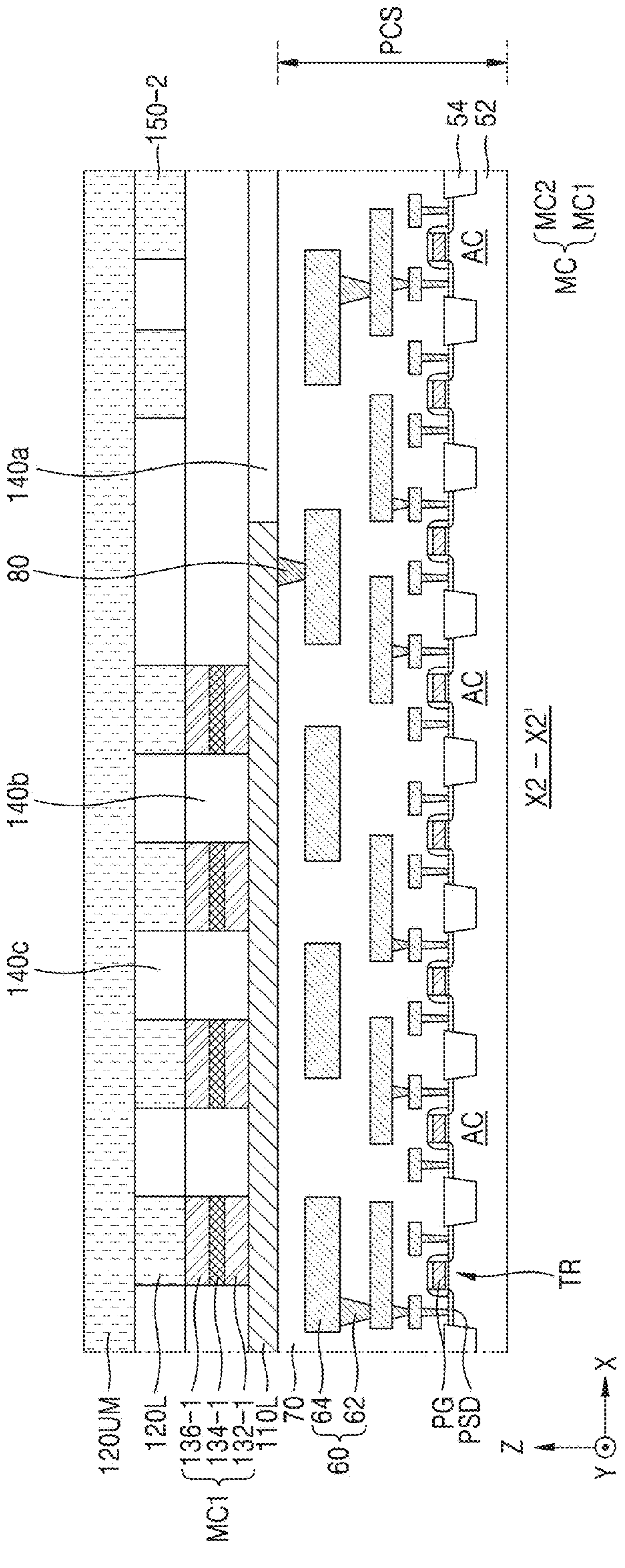
Figure 15C:
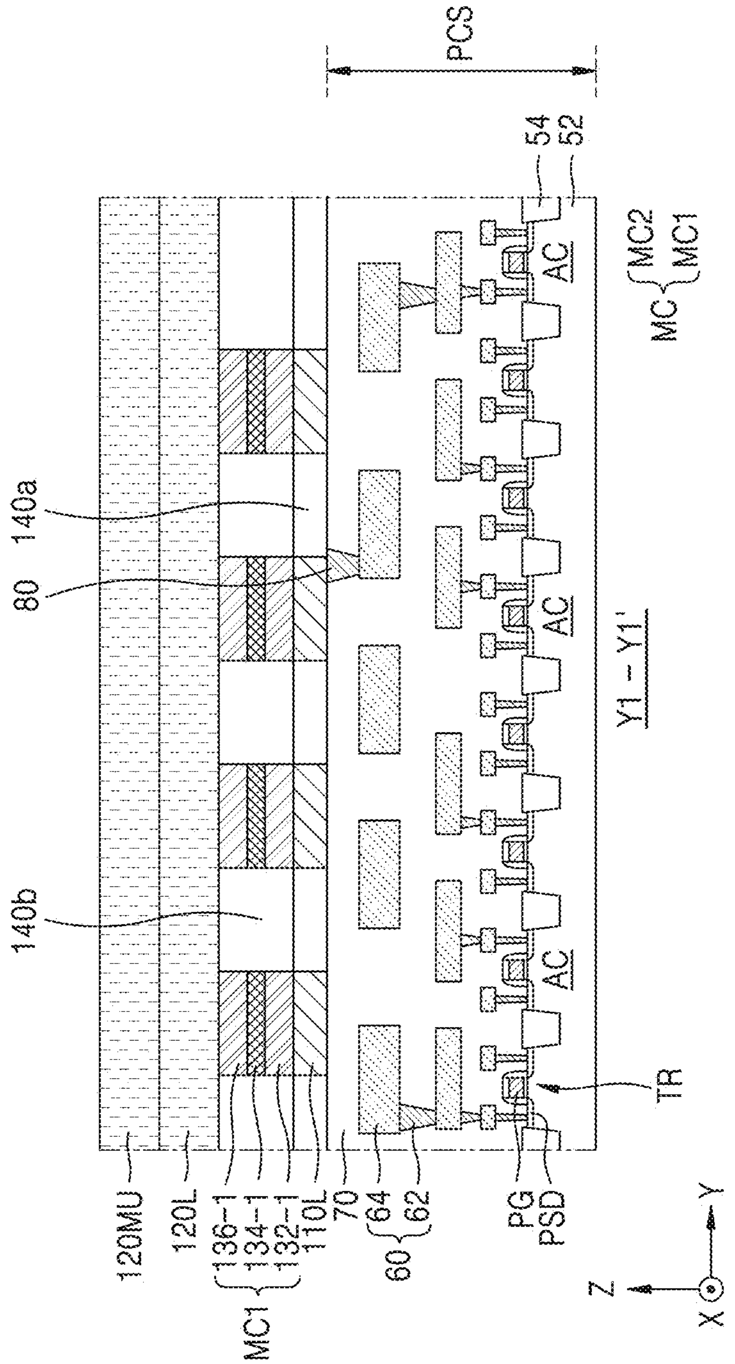
Figure 15D:
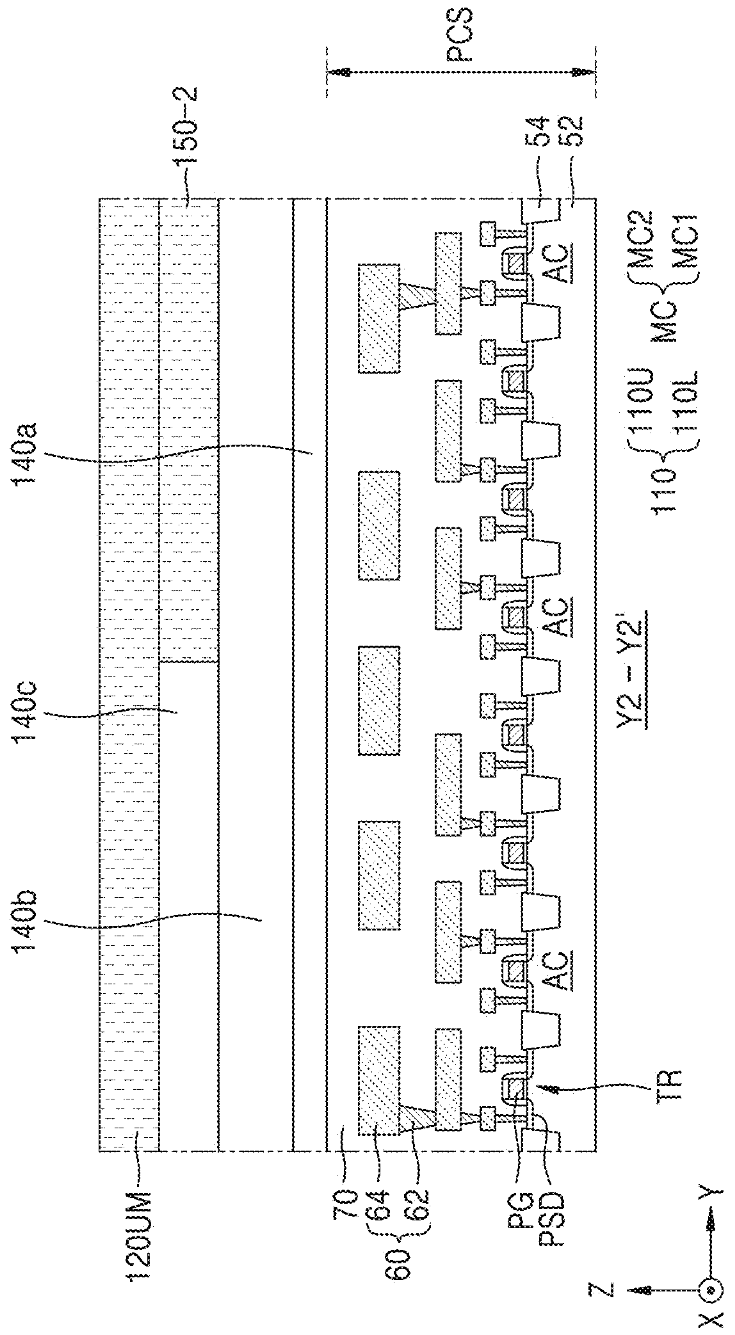
Figure 16A:
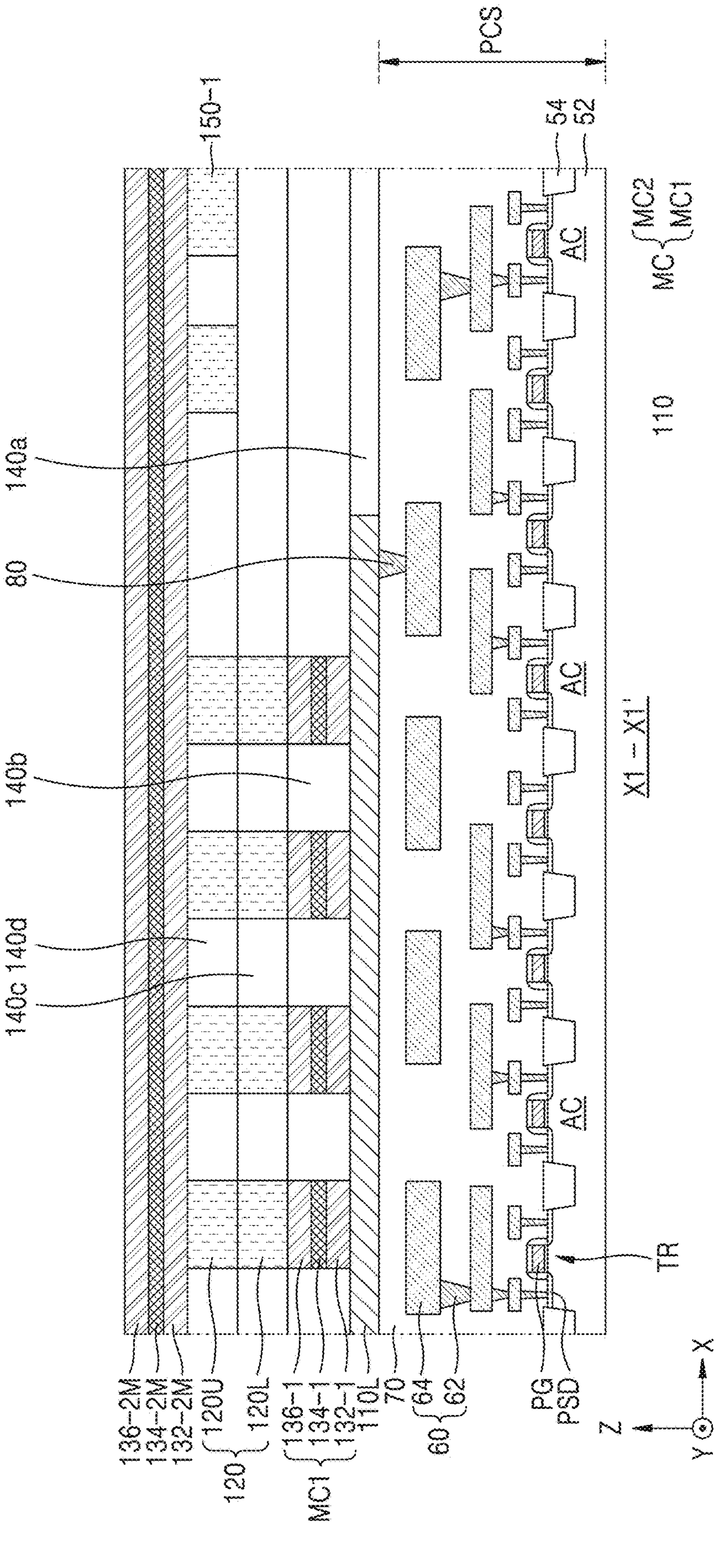
Figure 16B:
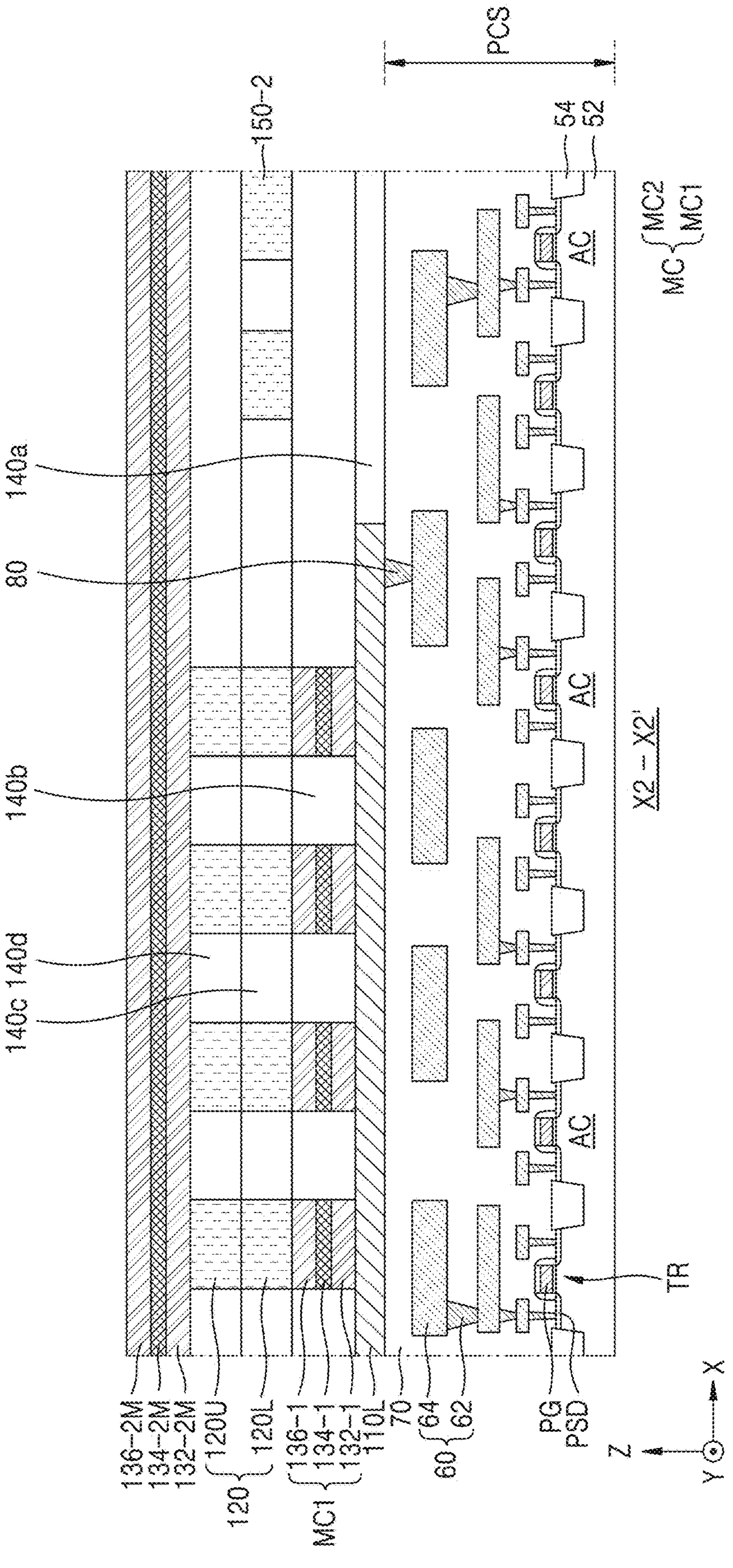
Figure 16C:
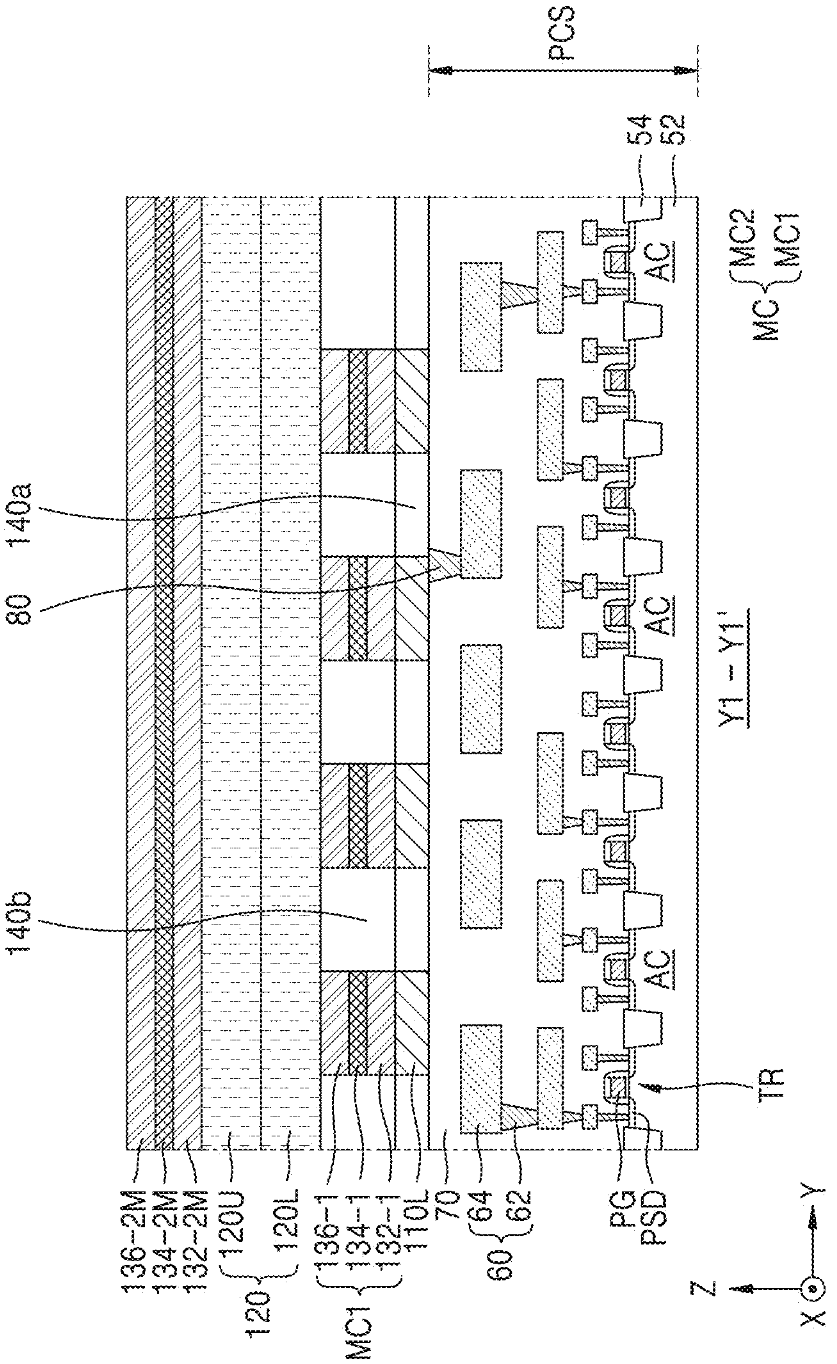
Figure 16D:
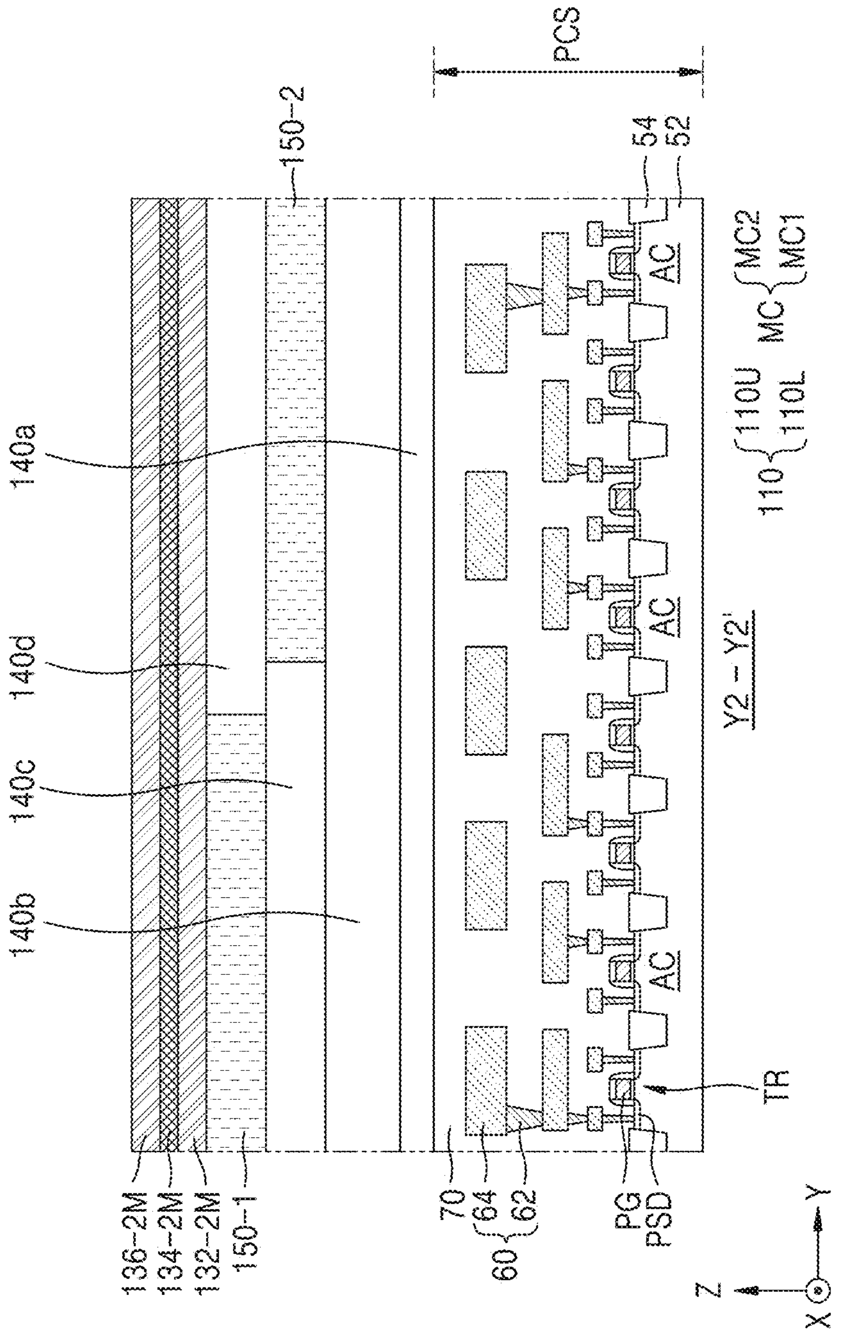
Figure 17A:
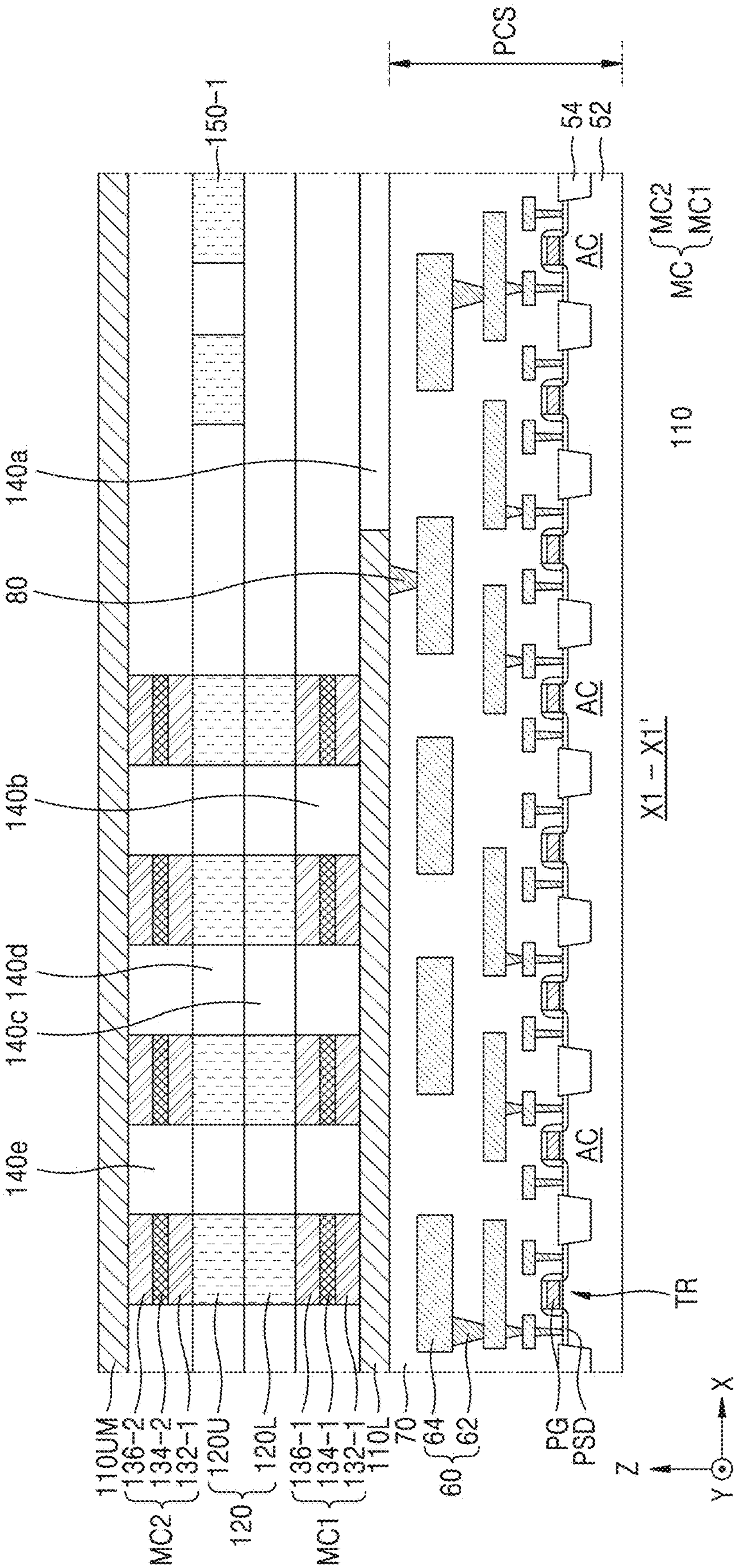
Figure 17B:
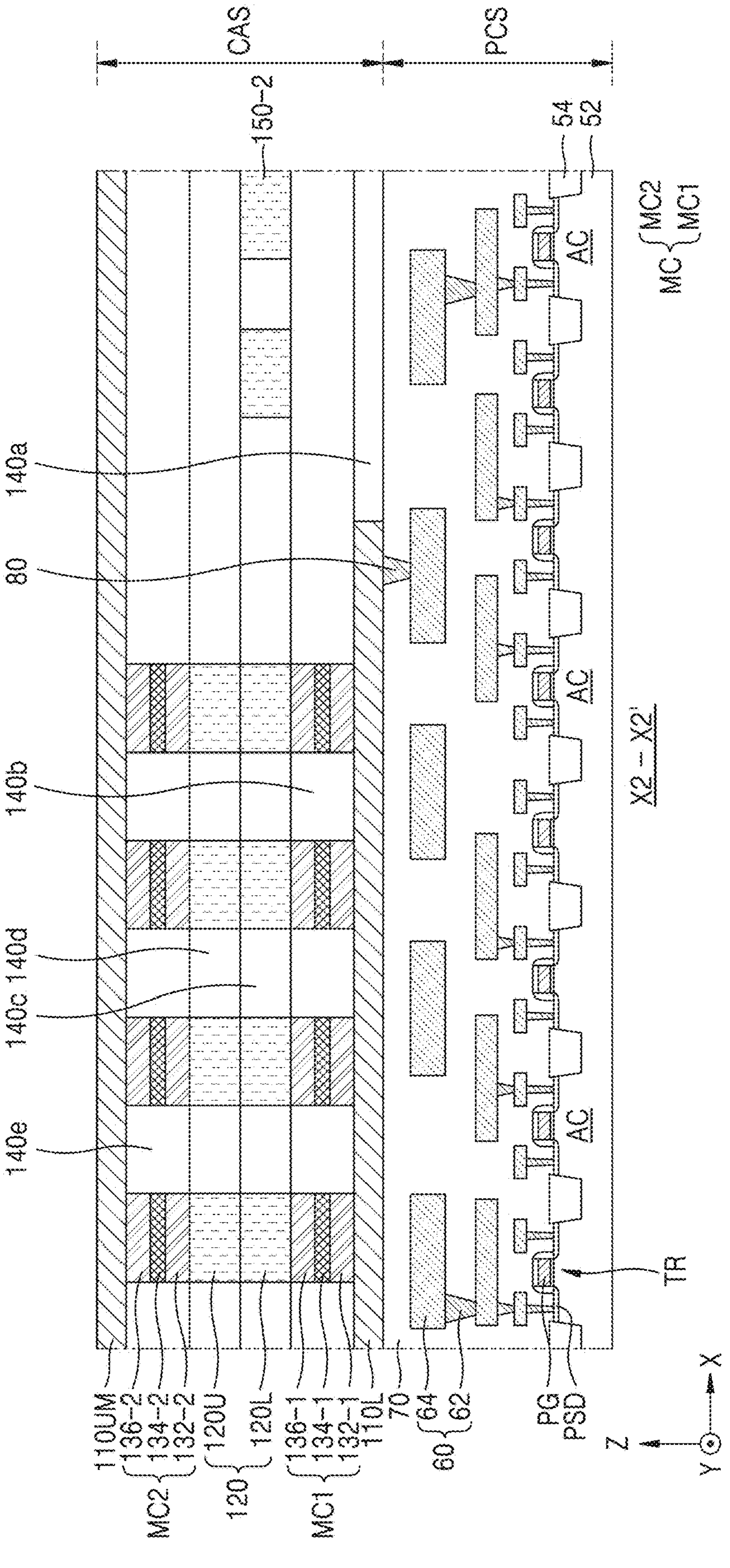
Figure 17C:
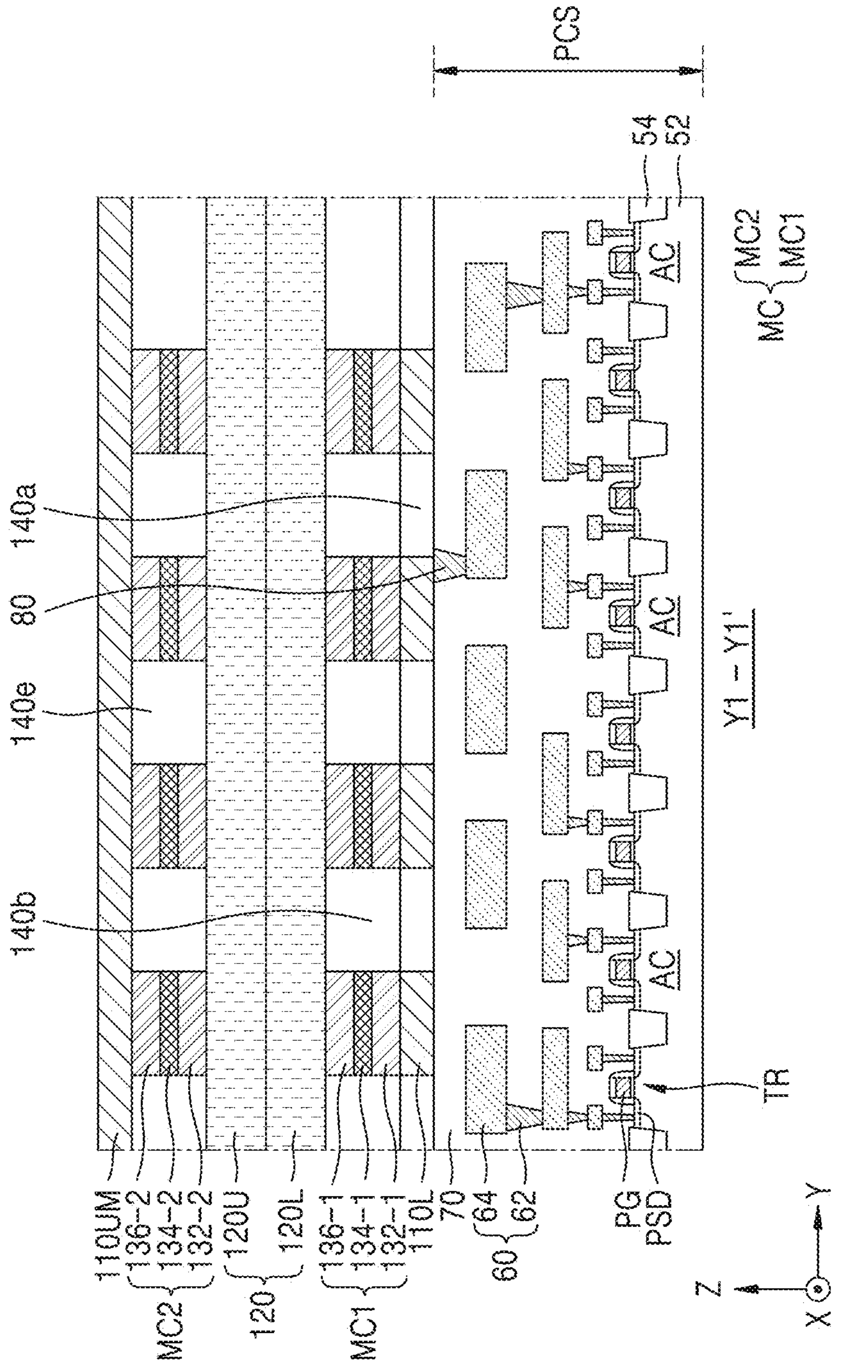
Figure 17D:
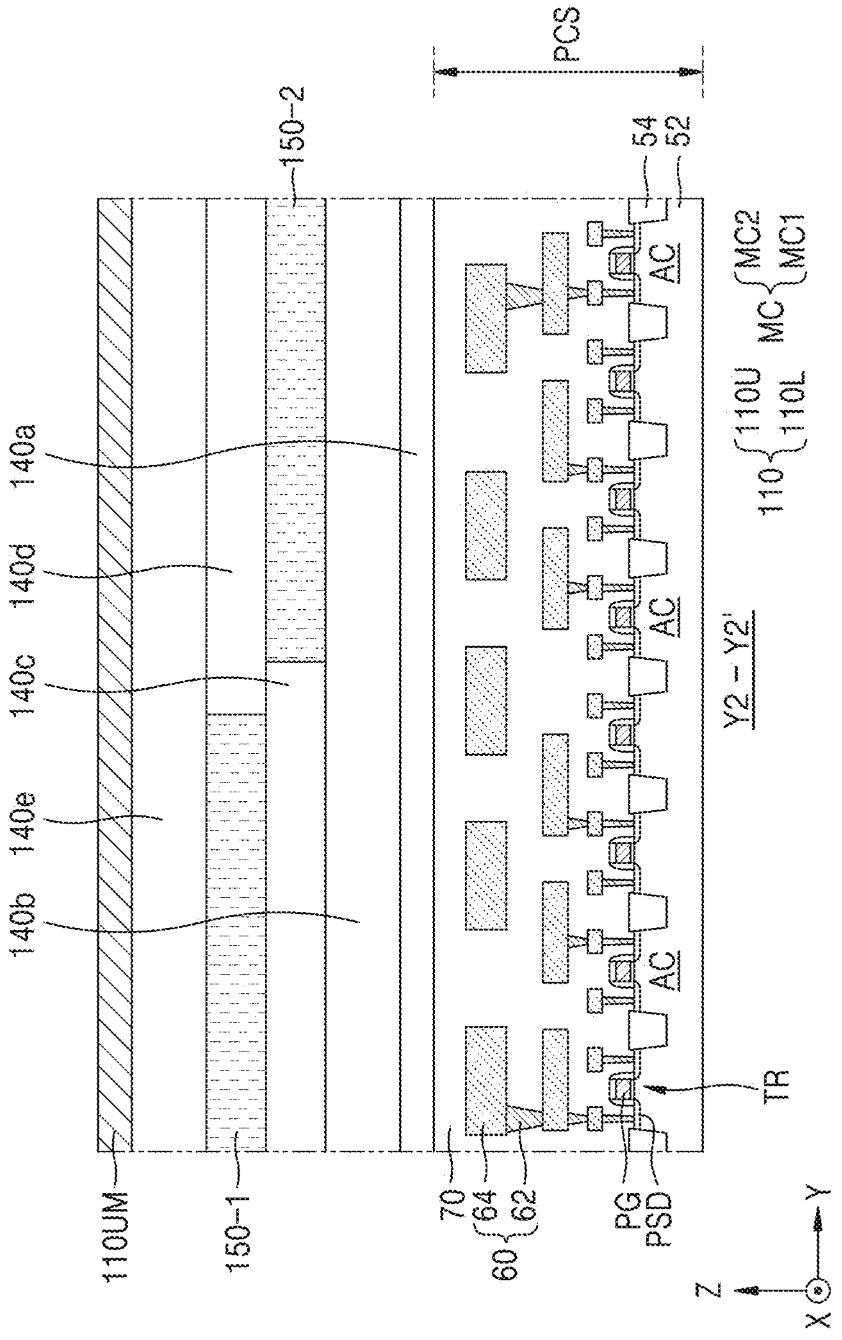

Referring to FIGS. 13A and 13B, from the resultant product of FIGS. 12A and 12B, by patterning the first conductive material layer (refer to 110LM in FIG. 12A), the plurality of first conductive lines 110L extending in parallel with each other in the first horizontal direction (X direction) may be formed, and spaces between the plurality of first conductive lines 110L may be filled by the first insulating layer 140*a*. Next, a lower electrode material layer 132-1M, a switching material layer 134-1M, and an upper electrode material layer 136-1M may be sequentially formed on the plurality of first conductive lines 110L and the first insulating layer 140*a*. The material of each of the lower electrode material layer 132-1M, the switching material layer 134-1M, and the upper electrode material layer 136-1M may be substantially the same as the material of each of the lower electrode layer 132-1, the switching material layer 134-1, and the upper electrode layer 136-1 described with reference to FIGS. 3 through 6.

Referring to FIGS. 14A, 14B, 14C, and 14D, from the resultant product of FIGS. 13A and 13B, by etching the lower electrode material layer (refer to 132-1M in FIG. 13A), the switching material layer (refer to 134-1M in FIG. 13A), and the upper electrode material layer (refer to 136-1M in FIG. 13A), the lower electrode layer 132-1, the switching material layer 134-1, and the upper electrode layer 136-1 may be formed, respectively. The lower electrode layer 132-1, the switching material layer 134-1, and the upper electrode layer 136-1 may constitute the first memory cell MC1 together. Next, spaces between each of the plurality of first memory cells MC1 may be filled with the second insulating layer 140*b*. Next, a second lower conductive material layer 120LM may be formed on the plurality of first memory cells MC1 and the second insulating layer 140*b*. The material of the second lower conductive material layer 120LM may be substantially the same as the material of the second lower conductive line 120L described with reference to FIGS. 3 through 6.

Referring to FIGS. 15A, 15B, 15C, and 15D, from the resultant product of FIGS. 14A, 14B, 14C, and 14D, by patterning the second lower conductive material layer (refer to 120LM in FIG. 14A), the plurality of second lower conductive lines 120L and the plurality of second dummy patterns 150-2 may be formed. Because the second lower conductive line 120L and the second dummy pattern 150-2 are formed by using the second lower conductive material layer (refer to 120LM in FIG. 14A), the second lower conductive line 120L and the second dummy pattern 150-2 may include the same material. Next, spaces between each of the plurality of second lower conductive lines 120L, spaces between each of the plurality of second dummy patterns 150-2, and spaces between the second lower conductive line 120L and the second dummy pattern 150-2 may be filled with the third insulating layer 140*c*. Next, a second upper conductive material layer 120UM may be formed on the second lower conductive line 120L, the plurality of second dummy patterns 150-2, and the third insulating layer 140*c*. The material of the second upper conductive material layer 120UM may be substantially the same as the material of the second upper conductive line 120U described with reference to FIGS. 3 through 6.

Referring to FIGS. 16A, 16B, 16C, and 16D, from the resultant product of FIGS. 15A, 15B, 15C, and 15D, by patterning the second upper conductive material layer (refer to 120UM in FIG. 14A), the plurality of second upper conductive lines 120U and the plurality of first dummy patterns 150-1 may be formed. Because the second upper conductive line 120U and the first dummy pattern 150-1 are formed by using the second upper conductive material layer (refer to 120UM in FIG. 15A), the second upper conductive line 120U and the first dummy pattern 150-1 may include the same material. Next, spaces between each of the plurality of second upper conductive lines 120U, spaces between each of the plurality of first dummy patterns 150-1, and spaces between the second upper conductive line 120U and the first dummy pattern 150-1 may be filled with the fourth insulating layer 140*d*. Next, a lower electrode material layer 132-2M, a switching material layer 134-2M, and an upper electrode material layer 136-2M may be sequentially formed on the second upper conductive line 120U, the plurality of first dummy patterns 150-1, and the fourth insulating layer 140*d*. The material of each of the lower electrode material layer 132-2M, the switching material layer 134-2M, and the upper electrode material layer 136-2M may be substantially the same as the material of each of the lower electrode layer 132-2, the switching material layer 134-2, and the upper electrode layer 136-2 described with reference to FIGS. 3 through 6.

Referring to FIGS. 17A, 17B, 17C, and 17D, from the resultant product of FIGS. 16A, 16B, 16C, and 16D, by etching the lower electrode material layer (refer to 132-2M in FIG. 16A), the switching material layer (refer to 134-2M in FIG. 16A), and the upper electrode material layer (refer to 136-2M in FIG. 16A), the lower electrode layer 132-2, the switching material layer 134-2, and the upper electrode layer 136-2 may be formed, respectively. The lower electrode layer 132-2, the switching material layer 134-2, and the upper electrode layer 136-2 may constitute the second memory cell MC2 together. Next, spaces between each of the plurality of second memory cells MC2 may be filled with the fifth insulating layer 140*e*. Next, a third conductive material layer 110UM may be formed on the plurality of second memory cells MC2 and the fifth insulating layer 140*e*. The material of the third conductive material layer 110UM may be substantially the same as the material of the third conductive line 110U described with reference to FIGS. 3 through 6.

Next, from the resultant product of FIGS. 17A, 17B, 17C, and 17D, by patterning the third conductive material layer (refer to 110UM in FIG. 17A), the plurality of third conductive lines 110U may be formed. Next, by filling spaces between each of the plurality of third conductive lines 110U, the memory device 100 illustrated in FIGS. 3 through 6 may be manufactured.

In some embodiments, each of the components represented by a block as illustrated in FIGS. 1 and 2 may be implemented as various numbers of hardware, software and/or firmware structures that execute respective functions described above, according to example embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of example embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of embodiments have been particularly shown and described, it will be understood that various changes in form and details may be made therein without departing from the spirit and scope of the following claims.

What is claimed is:

1. A memory device comprising:

a plurality of first conductive lines extending in a first horizontal direction on a substrate;

a plurality of second conductive lines extending on the plurality of first conductive lines in a second horizontal direction that crosses the first horizontal direction;

a plurality of third conductive lines extending on the plurality of second conductive lines in the first horizontal direction;

a plurality of first memory cells provided at portions where the plurality of first conductive lines cross the plurality of second conductive lines;

a plurality of second memory cells provided at portions where the plurality of second conductive lines cross the plurality of third conductive lines;

a plurality of first dummy patterns horizontally spaced apart from the plurality of first memory cells and the plurality of second memory cells; and a plurality of second dummy patterns horizontally spaced apart from the plurality of first memory cells and the plurality of second memory cells, the plurality of second dummy patterns facing the plurality of first dummy patterns, respectively, in the second horizontal direction, wherein the plurality of first dummy patterns and the plurality of second dummy patterns are on different vertical levels from each other.

2. The memory device of claim 1, wherein the plurality of first dummy patterns are farther from the substrate than the plurality of second dummy patterns.

3. The memory device of claim 2, wherein a lower surface of the plurality of first dummy patterns and an upper surface of the plurality of second dummy patterns are on an identical flat surface.

4. The memory device of claim 1, wherein the plurality of first dummy patterns and the plurality of second dummy patterns are spaced apart from each other in the second horizontal direction in a plan view.

5. The memory device of claim 1, wherein the plurality of second conductive lines comprise a plurality of second lower conductive lines on the plurality of first conductive lines and a plurality of second upper conductive lines on the plurality of second lower conductive lines, the plurality of first dummy patterns and the plurality of second upper conductive lines are commonly provided at a first vertical level, and the plurality of second dummy patterns and the plurality of second lower conductive lines are commonly provided at a second vertical level.

6. The memory device of claim 5, wherein the plurality of first dummy patterns and the plurality of second upper conductive lines comprise an identical material, and the plurality of second dummy patterns and the plurality of second lower conductive lines comprise an identical material.

7. The memory device of claim 5, wherein a pitch between each of the plurality of first dummy patterns is identical to a pitch between each of the plurality of second upper conductive lines, and a pitch between each of the plurality of second dummy patterns is identical to a pitch between each of the plurality of second lower conductive lines.

8. The memory device of claim 5, wherein a first dummy pattern of the plurality of first dummy patterns has an identical shape to a second upper conductive line of the plurality of second upper conductive lines in a plan view, and a second dummy pattern of the plurality of second dummy patterns has an identical shape to a second lower conductive line of the plurality of second lower conductive lines in a plan view.

9. The memory device of claim 5, wherein a first dummy pattern of the plurality of first dummy patterns has an identical horizontal width to a second upper conductive line of the plurality of second upper conductive lines, and a second dummy pattern of the plurality of second dummy patterns has an identical horizontal width to a second lower conductive line of the plurality of second lower conductive lines.

10. The memory device of claim 5, wherein the plurality of second upper conductive lines completely overlaps the plurality of second lower conductive lines in a vertical direction perpendicular to the first horizontal direction and the second horizontal direction.

11. The memory device of claim 5, wherein the plurality of second upper conductive lines and the plurality of second lower conductive lines comprise an identical material.

12. The memory device of claim 1, wherein each of the plurality of first memory cells and the plurality of second memory cells comprises a lower electrode layer on an upper surface of a first conductive line, an upper electrode layer under a second conductive line, and a switching material layer between the lower electrode layer and the upper electrode layer, and wherein the switching material layer is configured to function as a select device and a storage device.

13. A memory device comprising:

a wiring structure on a substrate;

a plurality of first conductive lines extending in a first horizontal direction on the wiring structure;

a plurality of contacts configured to connect the wiring structure to the plurality of first conductive lines;

a plurality of second conductive lines extending on the plurality of first conductive lines in a second horizontal direction that crosses the first horizontal direction;

a plurality of third conductive lines extending on the plurality of second conductive lines in the first horizontal direction;

a plurality of first memory cells provided at portions where the plurality of first conductive lines cross the plurality of second conductive lines;

a plurality of second memory cells provided at portions where the plurality of second conductive lines cross the plurality of third conductive lines;

a plurality of dummy patterns horizontally spaced apart from the plurality of first memory cells and the plurality of second memory cells; and a plurality of dummy contacts horizontally spaced apart from the plurality of first memory cells and the plurality of second memory cells, the plurality of dummy contacts facing the plurality of dummy patterns, respectively, in the first horizontal direction, wherein the plurality of dummy patterns and the plurality of dummy contacts are on different vertical levels from each other.

14. The memory device of claim 13, wherein the plurality of dummy patterns are farther from the substrate than the plurality of dummy contacts.

15. The memory device of claim 13, wherein a lower surface of the plurality of dummy patterns and an upper surface of the plurality of dummy contacts are on an identical flat surface.

16. The memory device of claim 13, wherein the plurality of dummy patterns and the plurality of dummy contacts are spaced apart from each other in the first horizontal direction in a plan view.

17. The memory device of claim 13, wherein the plurality of dummy patterns are at an identical vertical level to the plurality of first conductive lines, and the plurality of dummy contacts are at an identical vertical level to the plurality of contacts.

18. The memory device of claim 13, wherein a pitch between each of the plurality of dummy patterns is identical to a pitch between each of the plurality of first conductive lines, and a pitch between each of the plurality of dummy contacts is identical to a pitch between each of the plurality of contacts.

19. The memory device of claim 13, wherein a dummy pattern of the plurality of dummy patterns has an identical shape to a first conductive line of the plurality of first conductive lines in a plan view, and a dummy contact of the plurality of dummy contacts has an identical shape to a contact of the plurality of contacts in a plan view.

20. A memory device comprising:

a periphery circuit structure on a substrate; and a cell array structure on the periphery circuit structure, wherein the cell array structure comprises:

a plurality of first conductive lines extending on the substrate in a first horizontal direction;

a plurality of second conductive lines extending on the plurality of first conductive lines in a second horizontal direction that crosses the first horizontal direction, the plurality of second conductive lines including a plurality of second lower conductive lines and a plurality of second upper conductive lines;

a plurality of third conductive lines extending on the plurality of second conductive lines in the first horizontal direction;

a plurality of first memory cells provided at portions where the plurality of first conductive lines cross the plurality of second conductive lines;

a plurality of second memory cells provided at portions where the plurality of second conductive lines cross the plurality of third conductive lines;

a plurality of first dummy patterns horizontally spaced apart from the plurality of first memory cells and the plurality of second memory cells; and a plurality of second dummy patterns horizontally spaced apart from the plurality of first memory cells and the plurality of second memory cells, the plurality of second dummy patterns facing the plurality of first dummy patterns, respectively, in the second horizontal direction, wherein the plurality of second upper conductive lines and the plurality of second lower conductive lines completely overlap each other in a vertical direction perpendicular to the first horizontal direction and the second horizontal direction, and are at different vertical levels from the substrate along the vertical direction, and wherein the plurality of first dummy patterns and the plurality of second dummy patterns are spaced apart from each other in the second horizontal direction, the plurality of first dummy patterns and the plurality of second upper conductive lines are commonly provided at a first level along the vertical direction, and the plurality of second dummy patterns and the plurality of second lower conductive lines are commonly provided at a second level along the vertical direction.

* * * * *